(12) United States Patent
Arai

(10) Patent No.: US 11,495,571 B2
(45) Date of Patent: Nov. 8, 2022

(54) MOUNTING METHOD AND MOUNTING DEVICE

(71) Applicant: TORAY ENGINEERING CO., LTD., Tokyo (JP)

(72) Inventor: Yoshiyuki Arai, Otsu (JP)

(73) Assignee: TORAY ENGINEERING CO., LTD., Tokyo (JP)

( * ) Notice: Subject to any disclaimer, the term of this patent is extended or adjusted under 35 U.S.C. 154(b) by 700 days.

(21) Appl. No.: 16/326,512

(22) PCT Filed: Aug. 23, 2017

(86) PCT No.: PCT/JP2017/030101
§ 371 (c)(1),
(2) Date: Feb. 19, 2019

(87) PCT Pub. No.: WO2018/038153
PCT Pub. Date: Mar. 1, 2018

(65) Prior Publication Data
US 2021/0280440 A1 Sep. 9, 2021

(30) Foreign Application Priority Data

Aug. 24, 2016 (JP) .................................. 2016-163968
Jan. 21, 2017 (JP) .................................. 2017-009030

(51) Int. Cl.
*H01L 23/00* (2006.01)
*H01L 33/00* (2010.01)
(Continued)

(52) U.S. Cl.
CPC .............. *H01L 24/92* (2013.01); *H01L 21/60* (2021.08); *H01L 21/67103* (2013.01);
(Continued)

(58) Field of Classification Search
CPC ......... H01L 21/67144; H01L 21/67103; H01L 21/67115; H01L 21/67132; H01L 21/6836;
(Continued)

(56) References Cited

U.S. PATENT DOCUMENTS 7,067,926 B2 * 6/2006 Yamazaki ........... H01L 21/6835
257/E21.705
2012/0263946 A1 * 10/2012 Mitsukura ........... H01L 25/0657
428/345
(Continued)

FOREIGN PATENT DOCUMENTS

| JP | 2009-38331 A | 2/2009 |
| JP | 2010-219219 A | 9/2010 |
| JP | 5783481 B2 | 9/2015 |

OTHER PUBLICATIONS

International Search Report of the corresponding International Application No. PCT/JP2017/030101, dated Oct. 3, 2017.

*Primary Examiner* — Eduardo A Rodela
(74) *Attorney, Agent, or Firm* — Global IP Counselors, LLP

(57) ABSTRACT

A mounting method is a method for mounting a diced semiconductor chip having a first face that is held on a carrier substrate and a second face that is an opposite face of the first face on a circuit board placed on a mounting table. The mounting method includes affixing the second face of the semiconductor chip to an adhesive sheet, removing the carrier substrate from the semiconductor chip, reducing an adhesive strength of the adhesive sheet, and mounting the semiconductor chip on the circuit board by holding a first face side of the semiconductor chip with a head to separate the semiconductor chip from the adhesive sheet, and joining a second face side of the semiconductor chip to the circuit board.

3 Claims, 13 Drawing Sheets

(51) Int. Cl.
  *H01L 21/67*   (2006.01)
  *H01L 21/683*  (2006.01)
  *H01L 21/60*   (2006.01)
  *H01L 33/32*       (2010.01)

(52) U.S. Cl.
  CPC .. *H01L 21/67115* (2013.01); *H01L 21/67132* (2013.01); *H01L 21/67144* (2013.01); *H01L 21/6836* (2013.01); *H01L 24/81* (2013.01); *H01L 24/98* (2013.01); *H01L 33/0093* (2020.05); *H01L 21/6838* (2013.01); *H01L 24/75* (2013.01); *H01L 33/32* (2013.01); *H01L 2221/68368* (2013.01); *H01L 2221/68381* (2013.01); *H01L 2224/75251* (2013.01); *H01L 2224/75252* (2013.01); *H01L 2924/20103* (2013.01); *H01L 2924/20105* (2013.01)

(58) Field of Classification Search
  CPC ........... H01L 24/98; H01L 2221/68368; H01L 2221/68381; H01L 24/81; H01L 24/92; H01L 21/60
  See application file for complete search history.

(56)        References Cited

U.S. PATENT DOCUMENTS

| | | | |
|---|---|---|---|
| 2013/0260534 A1* | 10/2013 | Khanna | H01L 24/75 438/457 |
| 2015/0171049 A1* | 6/2015 | Wasserman | H01L 24/81 228/104 |
| 2015/0214040 A1* | 7/2015 | Celler | H01L 27/1266 438/459 |
| 2017/0141083 A1* | 5/2017 | Prabhu | H01L 23/481 |
| 2017/0358467 A1* | 12/2017 | Chang | H01L 21/568 |
| 2019/0326149 A1* | 10/2019 | Bower | B65G 47/91 |

* cited by examiner

MOUNTING METHOD AND MOUNTING DEVICE

CROSS-REFERENCE TO RELATED APPLICATIONS

This application is a U.S. National stage of International Application No. PCT/JP2017/030101 filed on Aug. 23, 2017. This application claims priority to Japanese Patent Application Nos. 2016-163968 filed on Aug. 24, 2016 and 2017-009030 filed on Jan. 21, 2017 with Japan Patent Office. The entire disclosures of Japanese Patent Application Nos. 2016-163968 and 2017-009030 are hereby incorporated herein by reference.

BACKGROUND

Field of the Invention

The present invention relates to a mounting method and a mounting device for stably and accurately mounting a semiconductor chip.

Background Information

In order to reduce cost, semiconductor chips have been made smaller, and efforts have been made to mount these miniaturized semiconductor chips accurately. In particular, in LEDs used in displays, semiconductor chips measuring 50 μm×50 μm or less (called micro LEDs) need to be mounted at high speed and at a precision of just a few micrometers.

Japanese Patent No. 5,783,481 (Patent Literature 1) discloses a configuration in which an adhesive layer composed of indium is provided between a semiconductor chip made of a micro LED and a carrier substrate composed of sapphire, the result being that the mounting face of the semiconductor chip is bonded to the carrier substrate, and the semiconductor chip is chucked with a heated head to melt the adhesive layer with heat from the head and separate the semiconductor chip, after which the semiconductor chip is mounted on the circuit board.

SUMMARY

However, with the invention described in Patent Literature 1, there is a possibility that the adhesive layer will be left behind on the semiconductor chip, which is a problem in that variance in the amount of this adhesive layer makes stable mounting difficult.

It is an object of the present invention to solve the above problem and to stably and accurately mount a semiconductor chip on a circuit board.

To solve the above problem, the present invention provides a mounting method in which a diced semiconductor chip whose first faces is held on a carrier substrate is mounted on a circuit board that has been placed on a mounting table, the method comprising the sequential execution of an adhesive sheet affixation step of affixing a second face, which is a face of the semiconductor chip on the opposite side from the first face held on the carrier substrate, to an adhesive sheet, a carrier substrate removal step of removing the carrier substrate from the semiconductor chip, an adhesive strength reduction step of reducing the adhesive strength of the adhesive sheet, and a mounting step of mounting the semiconductor chip on the circuit board by holding the first face side of the semiconductor chip with a head to separate the semiconductor chip from the adhesive sheet, and joining the second face side to the circuit board.

With this configuration, since the semiconductor chip is mounted while held by the head after the adhesive strength of the adhesive sheet has been reduced, the semiconductor chip can be mounted without anything unnecessary remaining on it, and it can be mounted stably and accurately on the circuit board.

The configuration can be such that in the carrier substrate removal step, the carrier substrate is separated by being irradiated with a laser beam.

With this configuration, the carrier substrate can be stably separated without leaving any adhesive layer behind on the semiconductor chip.

The configuration can be such that the adhesive strength reduction step involves heating the adhesive sheet and the semiconductor chip to a specific temperature to reduce the adhesive strength.

With this configuration, the adhesive strength of the adhesive sheet can be reduced, and the semiconductor chip can be stably separated.

The configuration can be such that the mounting step involves controlling the heating of the head and the mounting table such that the semiconductor chip can be mounted on the circuit board while maintaining the semiconductor chip at the specific temperature in the adhesive strength reduction step.

With this configuration, fluctuation in the temperature of the heated semiconductor chip, circuit board, adhesive sheet, head, and the like can be prevented, thermal contraction can be prevented in all of the members related to mounting, such as the semiconductor chip, the circuit board, the adhesive sheet, the head, and the like, and stable, accurate mounting can be carried out.

The configuration can be such that the joint strength between the circuit board and the semiconductor chip in the mounting of the semiconductor chip on the circuit board is greater than the holding strength of the head, and the holding strength of the head is greater than the adhesive strength of the adhesive sheet whose adhesive strength has been reduced.

With this configuration, the chucking of the semiconductor chip by the head and the mounting on the circuit board can be carried out stably.

To solve the above problem, the present invention provides a mounting method in which a diced semiconductor chip whose first faces is held on a carrier substrate is mounted on a circuit board that has been placed on a mounting table by a mounting head, the method comprising a first adhesive member affixation step of affixing a second face, which is a face of the semiconductor chip on the opposite side from the first face held on the carrier substrate, to a first adhesive member, a carrier substrate removal step of removing the carrier substrate from the semiconductor chip, a second adhesive member affixation step of affixing a second adhesive member to the first face of the semiconductor chip, a first adhesive strength reduction step of reducing the adhesive strength of the first adhesive member, a third adhesive member affixation step of separating the semiconductor chip to which the second adhesive member has been affixed from the first adhesive member, and affixing the second face to a third adhesive member, a second adhesive strength reduction step of reducing the adhesive strength of the second adhesive member, and a mounting step of mounting the semiconductor chip on the circuit board by holding the first face of the semiconductor chip with the mounting head to separate the semiconductor chip from the third adhesive member, and joining the second face to the circuit board, wherein the adhesive strength of the third adhesive member is less than the adhesive strength of the first adhesive member.

With this configuration, since the adhesive strength of the first adhesive member is reduced after the second adhesive member is affixed to the semiconductor chip, there is no misalignment or incorrect orientation of the semiconductor chip due to foaming of the first adhesive member, and since the semiconductor chip to be mounted are affixed to the third adhesive member having a lower adhesive strength than the first adhesive member, the semiconductor chip can be easily separated and can be stably and accurately mounted on the circuit board.

The configuration can be such that the first adhesive strength reduction step involves reducing the adhesive strength of the first adhesive member by heating the first adhesive member and the semiconductor chip to a first specific temperature at which the adhesive strength of the first adhesive member decreases, and the second adhesive strength reduction step involves reducing the adhesive strength of the second adhesive member by heating the second adhesive member and the semiconductor chip to a second specific temperature that is higher than the first specific temperature and at which the adhesive strength of the second adhesive member decreases.

With this configuration, since the adhesive strength of the second adhesive member does not decrease at the first specific temperature, the semiconductor chip can be fixed with the second adhesive member, and misalignment or incorrect orientation of the semiconductor chip due to foaming when the adhesive strength of the first adhesive member decreases can be prevented. Also, it is possible to stably reduce the adhesive strength of the second adhesive member at the second specific temperature.

The configuration can be such that the mounting step involves controlling the heating of a third adhesive member holder that holds the third adhesive member, the mounting head, and the mounting table such that the semiconductor chip can be mounted on the circuit board while maintaining the semiconductor chip at the second specific temperature in the second adhesive strength reduction step.

With this configuration, the fluctuation in the temperature of the heated semiconductor chip, circuit board, mounting head, and the like can be prevented, thermal expansion and contraction can be prevented in all of the members related to mounting, and stable, accurate mounting can be carried out.

To solve the above problem, the present invention provides a mounting device with which a diced semiconductor chip whose first faces is held on a carrier substrate is mounted on a circuit board that has been placed on a mounting table, the device comprising an adhesive sheet holder that holds an adhesive sheet to which a second face of the semiconductor chip held on the carrier substrate, which is a face on the opposite side from the first face, is affixed, a carrier substrate remover that removes the carrier substrate from the semiconductor chip affixed to the adhesive sheet, an adhesive strength reducer that reduces the adhesive strength of the adhesive sheet, a head capable of holding the semiconductor chip from the first face side, and a controller that performs control such that the head holds the semiconductor chip to separates the semiconductor chip from the adhesive sheet, and joins the second face side to the circuit board.

With this configuration, since the semiconductor chip are mounted while held by the head after the adhesive strength of the adhesive sheet has been reduced, it is possible to mount the semiconductor chip without anything unnecessary being left behind on it, and it can be stably and accurately mounted on the circuit board.

The configuration can be such that the carrier substrate remover includes a laser beam emitter capable of irradiating the carrier substrate with a laser beam.

With this configuration, the carrier substrate can be stably separated and removed from the semiconductor chip without leaving behind any adhesive layer on the semiconductor chip.

The configuration can be such that the adhesive strength reducer includes a heater that heats the adhesive sheet and the semiconductor chip to a specific temperature.

With this configuration, the adhesive strength of the adhesive sheet can be reduced, and the semiconductor chip can be stably separated.

The configuration can be such that the head and the mounting table are each capable of heating, and the controller controls the heating temperature of the adhesive strength reducer, the head, and the mounting table such that the semiconductor chip can be mounted on the circuit board while maintaining the semiconductor chip at the specific temperature in the adhesive strength reducer.

With this configuration, fluctuation in the temperature of the heated semiconductor chip, circuit board, adhesive sheet, head, and so forth can be prevented, thermal contraction of all the members related to mounting, such as the semiconductor chip, the circuit board, the adhesive sheet, the head, and so forth, can be prevented, and stable, accurate mounting can be carried out.

The configuration can be such that the joint strength between the circuit board and the semiconductor chip in the mounting of the semiconductor chip on the circuit board is greater than the holding strength of the head, and the holding strength of the head is greater than the adhesive strength of the adhesive sheet whose adhesive strength has been reduced.

With this configuration, the chucking of the semiconductor chip by the head and the mounting on the circuit board can be carried out stably.

To solve the above problem, the present invention provides a mounting device with which a diced semiconductor chip whose first faces is held on a carrier substrate is mounted on a circuit board that has been placed on a mounting table by a mounting head, the device comprising a first adhesive member holder that has a first adhesive member heating mechanism and that holds a first adhesive member, a carrier substrate remover that removes the carrier substrate from the semiconductor chip affixed to the first adhesive member, a first transfer head that has a first transfer head heating mechanism and that affixes a second adhesive member to a first face of the semiconductor chip, a second transfer head that has a second transfer head heating mechanism and that affixes the semiconductor chips to a third adhesive member, a third adhesive member holder that has a third adhesive member heating mechanism and that holds the third adhesive member, a first adhesive strength reducer that reduces the adhesive strength of the first adhesive member, a second adhesive strength reducer that reduces the adhesive strength of the second adhesive member, and a mounting head for mounting the semiconductor chip on the circuit board by holding the first face of the semiconductor chip and separating the semiconductor chip from the third adhesive member, and joining the second face to the circuit board, wherein the adhesive strength of the third adhesive member is less than the adhesive strength of the first adhesive member.

With this configuration, since the adhesive strength of the first adhesive member is reduced after the second adhesive member is affixed to the semiconductor chip, there is no misalignment or incorrect orientation of the semiconductor chip due to foaming of the first adhesive member, and since the semiconductor chip to be mounted is affixed to the third adhesive member having a lower adhesive strength than the first adhesive member, the semiconductor chip can be easily separated and can be stably and accurately mounted on the circuit board.

The configuration can be such that the first adhesive strength reducer performs control such that the first adhesive member heating mechanism and the first transfer head heating mechanism are heated to a first specific temperature at which the adhesive strength of the first adhesive member decreases, and the second adhesive strength reducer performs control such that the third adhesive member heating mechanism and the second transfer head heating mechanism are heated to a second specific temperature that is higher than the first specific temperature and at which the adhesive strength of the second adhesive member decreases.

With this configuration, since the adhesive strength of the second adhesive member does not decrease at the first specific temperature, the semiconductor chip can be fixed with the second adhesive member, and misalignment or incorrect orientation of the semiconductor chip due to foaming when the adhesive strength of the first adhesive member is reduced can be prevented. Also, the adhesive strength of the second adhesive member can be stably reduced at the second specific temperature.

The configuration can be such that the mounting head has a mounting head heating mechanism, the mounting table has a mounting table heating mechanism, and there is further provided a mounting temperature controller that controls the heating temperature of a third adhesive member heating mechanism, the mounting head heating mechanism, and the mounting table heating mechanism such that the semiconductor chip is mounted on the circuit board while maintaining the semiconductor chip at the second specific temperature.

With this configuration, fluctuation in the temperature of the heated semiconductor chip, circuit board, mounting head, and the like can be prevented, thermal expansion and contraction can be prevented in all of the members related to mounting, and stable, accurate mounting can be carried out.

The mounting method and mounting device of the present invention allow semiconductor chip to be stably and accurately mounted on a circuit board.

DETAILED DESCRIPTION OF EMBODIMENTS

First Embodiment

Figure 1A:
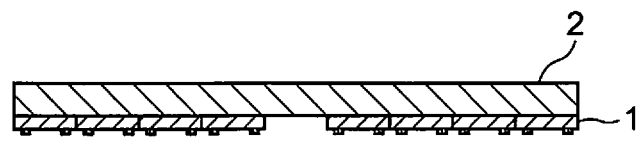
FIGS. 1A, 1B and 1C are diagrams illustrating the first half of a mounting method in a first embodiment of the present invention.
Figure 1B:
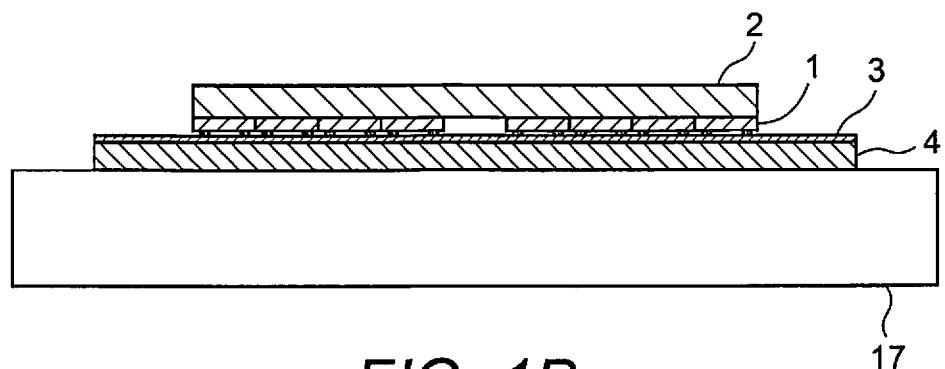
Figure 1C:
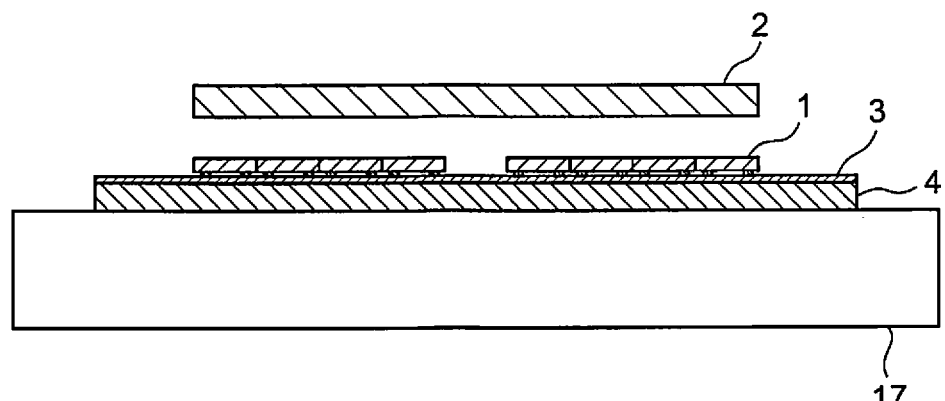
Figure 2A:
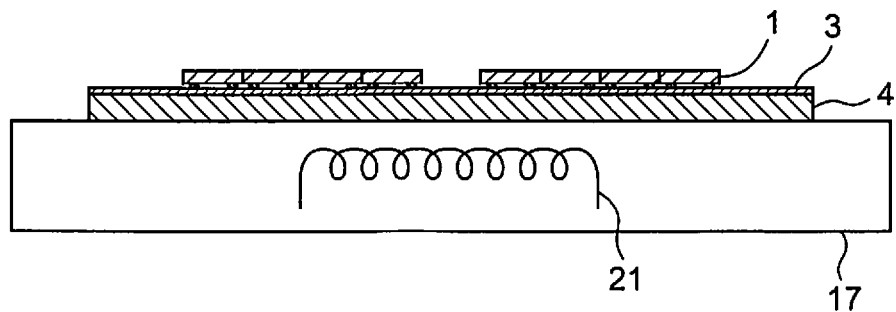
FIGS. 2A, 2B and 2C are diagrams illustrating the second half of the mounting method in the first embodiment of the present invention.
Figure 2B:
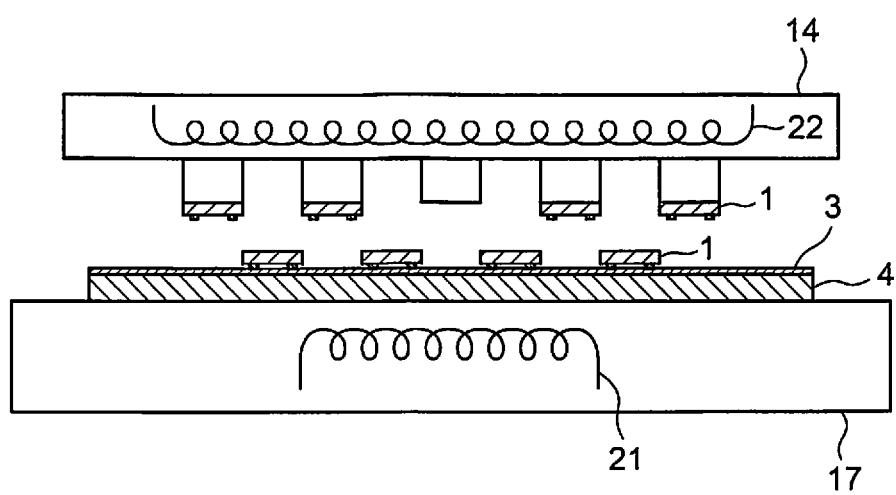
Figure 2C:
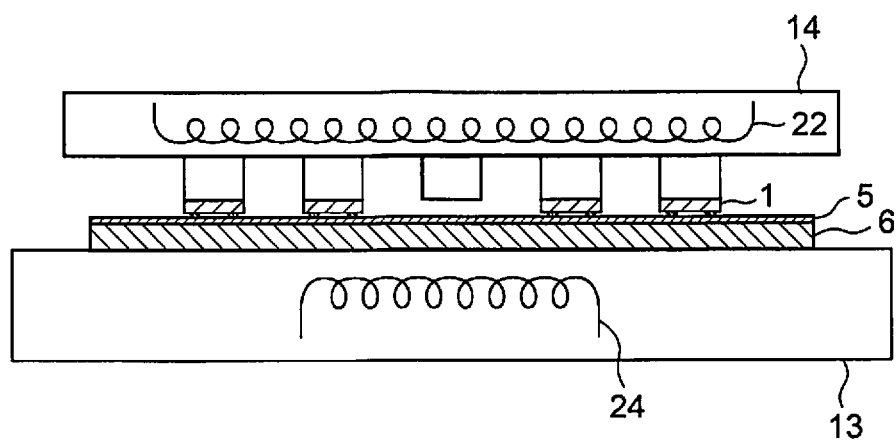
Figure 3:
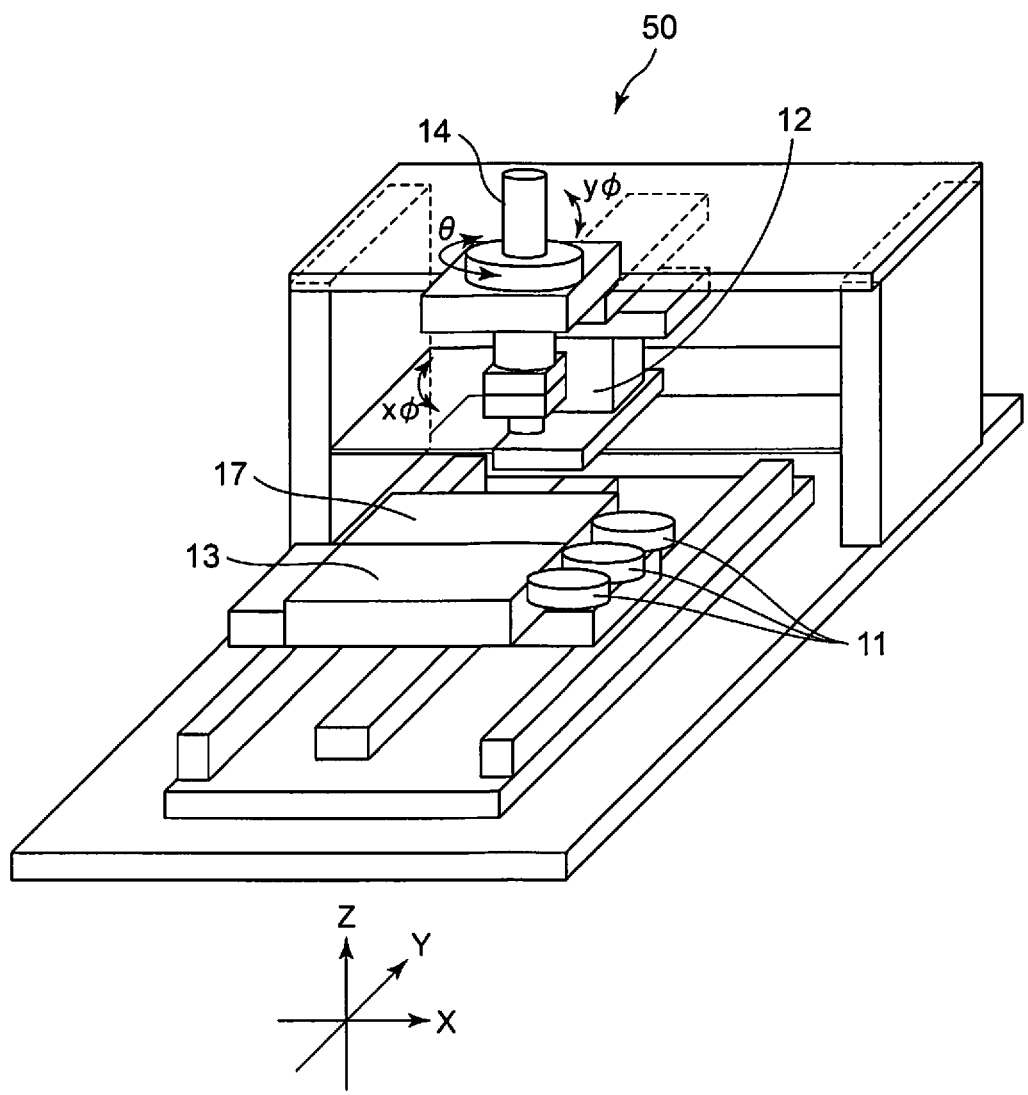
FIG. 3 is a diagram illustrating a mounting device in the first embodiment of the present invention.
Figure 4:
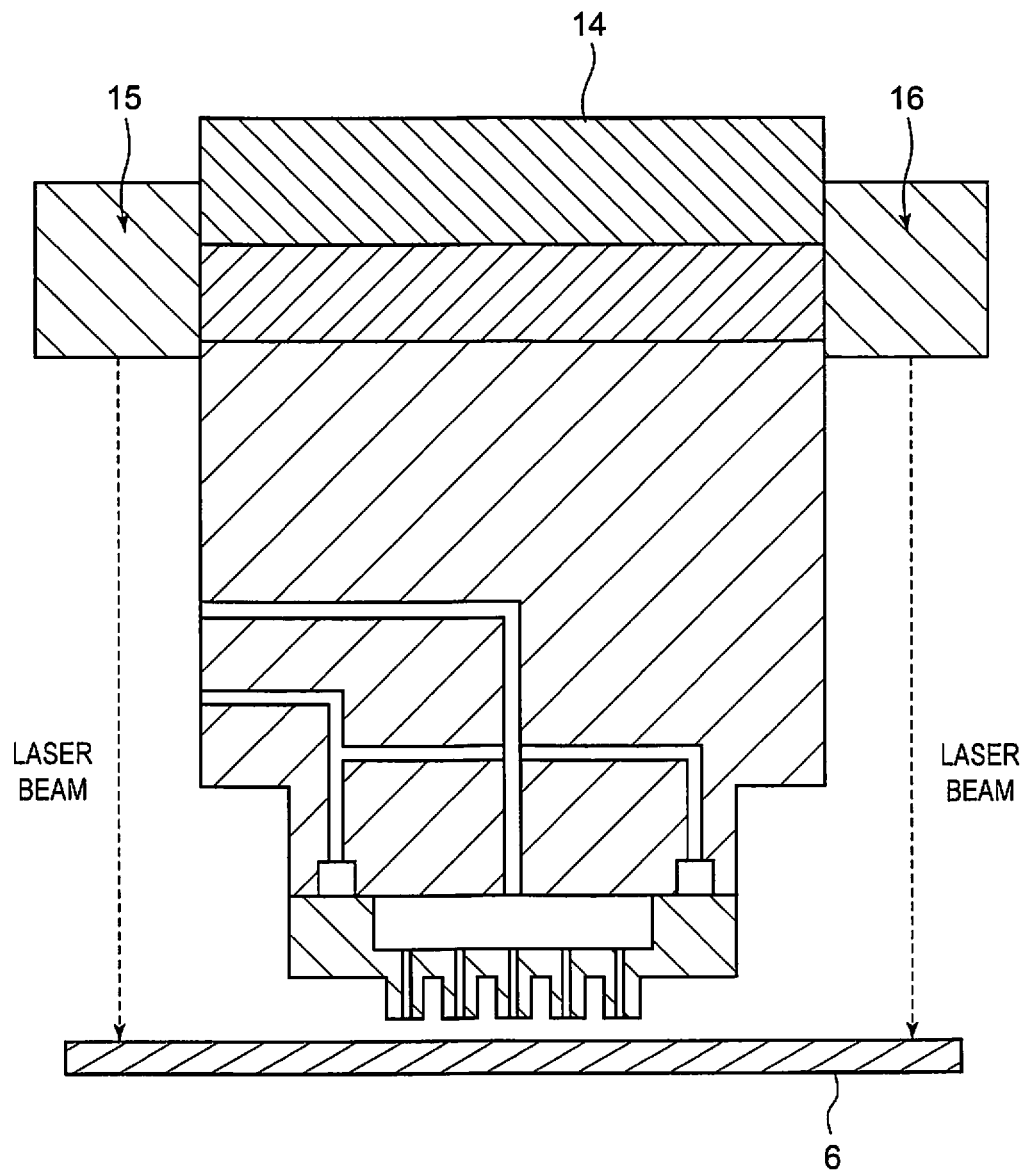
FIG. 4 is a diagram illustrating a head portion of the mounting device in the first embodiment of the present invention.
Figure 5A:
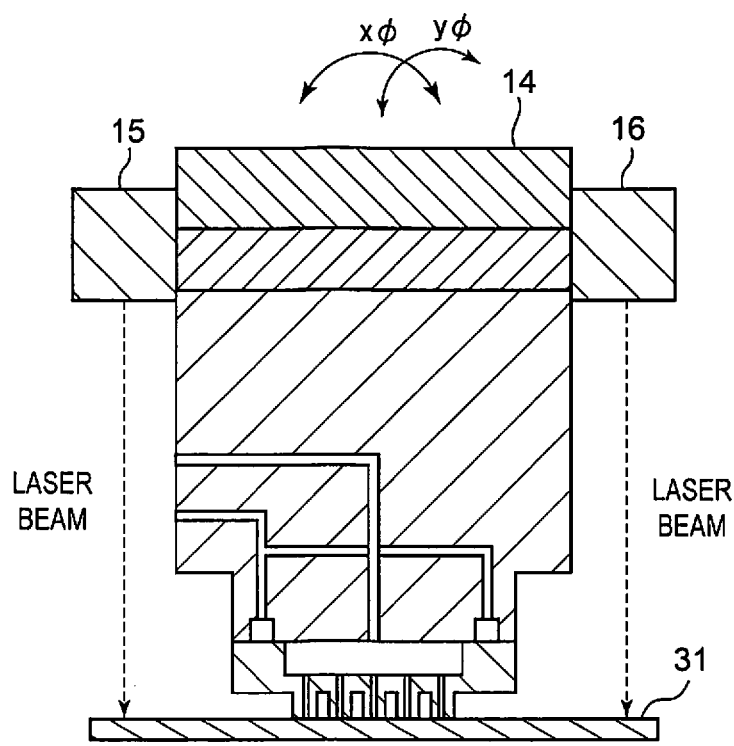
FIGS. 5A and 5B are diagrams illustrating the adjustment of the parallelism of the head of the mounting device in the first embodiment of the present invention.
Figure 5B:
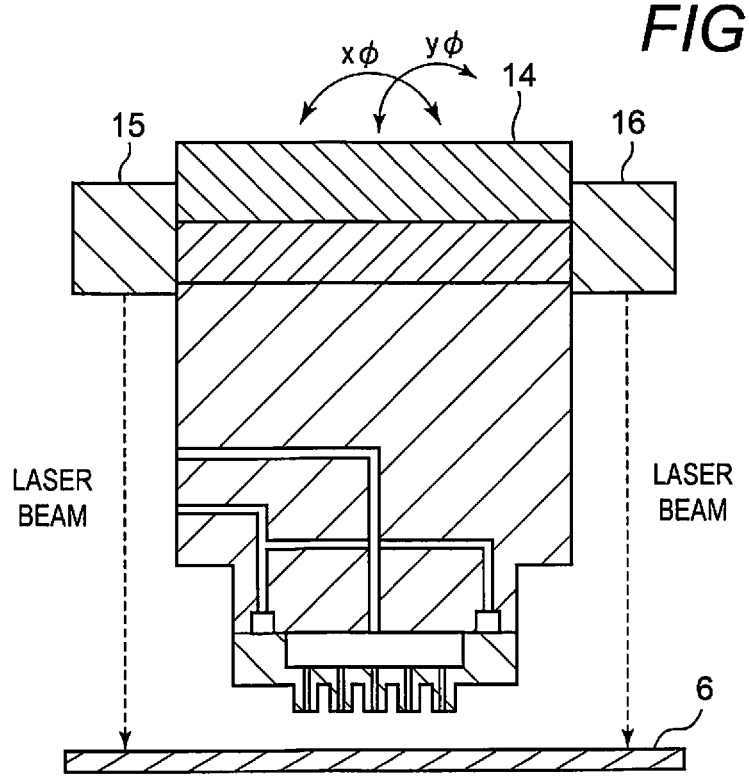

A first embodiment of the present invention will be described through reference to FIGS. 1A to 5B. FIGS. 1A, 1B and 1C are diagrams illustrating the first half of a mounting method in the first embodiment of the present invention. FIGS. 2A, 2B and 2C are diagrams illustrating the second half of the mounting method in the first embodiment of the present invention. FIG. 3 is a diagram illustrating a mounting device in the first embodiment of the present invention. FIG. 4 is a diagram illustrating a head portion of the mounting device in the first embodiment of the present invention. FIGS. 5A and 5B are diagrams illustrating the adjustment of the parallelism of the head of the mounting device in the first embodiment of the present invention.

In the present invention, of the two main faces of a semiconductor chip, the face held by the carrier substrate shall be termed the first face, the face on the opposite side from the first face is defined as the second face, and it shall be assumed that bumps are formed on the second face.

First, the steps of the mounting method in the first embodiment of the present invention will be described through reference to FIGS. 1A to 2C. FIG. 1A shows a plurality of diced semiconductor chips 1 whose first face is held on a carrier substrate 2. The carrier substrate 2 has a circular or quadrangular shape extending in the depth direction of FIGS. 1A to 2C, and is made of silicon, gallium arsenide, sapphire, or the like. A plurality of semiconductor chips 1 (from several hundred to tens of thousands) are two-dimensionally arranged along the spread of the carrier substrate 2. With small semiconductor chips 1 called micro LEDs, the size is 50 μm×50 μm or less, and these are arranged at a pitch obtained by adding a dicing width to this size. Such small semiconductor chips 1 need to be mounted on the circuit board 6 with high accuracy (for example, accuracy of 1 μm or less). With the semiconductor chips 1 in the first embodiment, each semiconductor chip 1 is inspected in advance and any defective semiconductor chips are removed. More specifically, a laser beam that is more powerful than when laser lift-off (discussed below) is used is emitted to burn out the defective chips. Also, bumps are formed on the second faces of the semiconductor chips 1.

FIG. 1B shows an adhesive sheet affixation step in which second faces, which are the faces of the semiconductor chips 1 on the opposite side from the first faces, which are the faces held on the carrier substrate 2, are affixed to an adhesive sheet 4. The adhesive sheet 4 is held by vacuum suction to an adhesive sheet holder 17, and an adhesive film 3 is formed on the face to which the semiconductor chip 1 is affixed. A property of the adhesive film 3 in the first embodiment is that it has adhesion at room temperature, but its adhesive strength is reduced by heating. In this adhesive sheet affixation step, the carrier substrate 2 holding the semiconductor chip 1 is chucked with a head 14 (discussed below) such that it can be handled, and the second faces of the semiconductor chips 1 are affixed on the adhesive film 3 of the adhesive sheet 4 held by the adhesive sheet holder 17.

Next, the carrier substrate removal step is executed as shown in FIG. 1C. In the carrier substrate removal step, the carrier substrate 2 is separated from the semiconductor chips 1 by a method called laser lift-off. For example, with micro LEDs, the carrier substrate 2 is irradiated with an excimer laser to decompose part of the GaN layer of the micro LEDs, which is the semiconductor chips 1, into gallium and nitrogen, and then separate and remove the carrier substrate 2, which is made of sapphire. The separated carrier substrate 2 is chucked to the head 14 and removed.

In the first embodiment, the carrier substrate 2 is separated from the semiconductor chips 1 by a method called laser lift-off in which the carrier substrate 2 is irradiated with a laser beam in the carrier substrate removal step, but this is not the only option, and the method can be varied as needed. For example, the carrier substrate 2 can be removed by scraping it off from the opposite side from the side on which the semiconductor chips 1 are provided. This is called back grinding, and this back grinding technique is used particularly in the case of red LEDs, since laser lift-off cannot be applied.

After this, the adhesive strength reduction step shown in FIG. 2A is executed. In the adhesive strength reduction step, the adhesive strength of the adhesive film 3 is reduced by heating the adhesive film 3 of the adhesive sheet 4 to a specific temperature. The specific temperature for reducing the adhesive strength is the "temperature at which bumps can be joined" in the mounting step (discussed below). To set this "temperature at which bumps can be joined" to the specific temperature, a temperature such as 90° C., 150° C., or 180° C. is used by selecting the type of the adhesive film 3. In the first embodiment, the "temperature at which bumps can be joined" is about 150° C., and an adhesive sheet 4 is used that employs an adhesive film 3 whose adhesive strength drops substantially to zero at this temperature. That is, when an adhesive sheet 4 employing an adhesive film 3 whose adhesive strength drops substantially to zero at 150° C. is used, 150° C. is set as the specific temperature, and the adhesive sheet 4 is heated to 150° C., the adhesive film 3 also goes to 150° C. and its adhesive strength decreases, making it possible for the semiconductor chips 1 to be separated with ease. In the first embodiment, a heater 21 in the adhesive sheet holder 17 is controlled such that the semiconductor chips 1 are also heated to 150° C., which is the same specific temperature, during the heating of the adhesive sheet 4. Thus using the same specific temperature in the adhesive strength reduction step as the "temperature at which bumps can be joined" in the joining of the semiconductor chips 1 to the circuit board 6 in the mounting step (discussed below), allows the temperature of the semiconductor chips 1 to be kept constant from the adhesive strength reduction step to the mounting step, so expansion and contraction can be avoided, and stable, accurate mounting can be accomplished.

Next, the mounting step shown in FIGS. 2B and 2C is executed. In the mounting step, as shown in FIG. 2B, a plurality of semiconductor chips 1 on the adhesive sheet 4 are chucked at the same time by the head 14 and picked up. The number of semiconductor chips 1 picked up can be set as needed according to the configuration of the head 14, but for high-speed mounting, it is preferable to pick up as many semiconductor chips 1 as possible. In the first embodiment, the head 14 is configured to be able to pick up 10,000 semiconductor chips 1. In this pickup, the temperature of the semiconductor chips 1 picked up is controlled by a heater 22 provided inside the head 14 to be a specific temperature in the adhesive strength reduction step, that is, the "temperature at which bumps can be joined" (150° C. in the first embodiment). Also, the heater 21 in the adhesive sheet holder 17 is similarly controlled to maintain the temperature of the semiconductor chips 1 at a specific temperature in the adhesive strength reduction step, that is, "the temperature at which the bumps can be joined" (150° C. in the first embodiment). The pitch at which the semiconductor chips 1 are picked up by the head 14 is configured to match the pitch at which the semiconductor chips 1 are mounted on the circuit board 6 (discussed below). Here, the "temperature at which the bumps can be joined" is a temperature suitable for joining the bumps provided to the semiconductor chips 1 with the electrodes of the circuit board 6, and at this temperature, the bumps are sticky and suitable for joining, but below this temperature the bumps will not be sticky, and above this temperature the bumps will be oxidized and not be suitable for joining.

As shown in FIG. 2C, the plurality of semiconductor chips 1 picked up by the head 14 are joined to and mounted on the circuit board 6, which is held on a mounting table 13, when the head 14 or the mounting table 13 moves as needed in the X, Y, and Z directions. In the first embodiment, the circuit board 6 consists of a circuit formed on the surface of glass. In order to mount 10,000 semiconductor chips 1 at a time on the circuit board 6, not only is accurate positioning in the X and Y directions required, but also the parallelism between the semiconductor chips 1 and the circuit board 6 needs to be adjusted. By performing parallelism adjustment (discussed below), mounting can be performed by moving al of the semiconductor chips 1 by the same height (in the Z direction).

The mounting table 13 is provided with a heater 24. The bumps provided on the semiconductor chips 1 and the electrodes of the circuit board 6 are joined together by controlling the heating of the mounting table 13 along with the head 14 to the "temperature at which bumps can be joined." Controlling the heating of the head 14 and the mounting table 13 maintains the semiconductor chips 1 at a specific temperature in the adhesive strength reduction step, that is, "the temperature at which bumps can be joined" (150° C. in the first embodiment), also similarly maintains the circuit board 6 at a specific temperature in the adhesive strength reduction step, and maintains not only the semiconductor chips 1, but also the circuit board 6, the adhesive sheet 4, and the head 14 at the same specific temperature from the adhesive strength reduction step to the mounting step. This avoids thermal contraction of the semiconductor chips 1 and the circuit board 6, and allows accurate mounting to be performed stably.

In the mounting step, the configuration is such that the joining strength between the circuit board 6 and the semiconductor chips 1 in the mounting of the semiconductor chips 1 on the circuit board 6 is greater than the holding strength of the head 14, and the holding strength of the head 14 is greater than the adhesive strength of the adhesive sheet 4 whose adhesive strength has been reduced. That is, the head 14 is always applying vacuum suction, and the semiconductor chips 1 are held by this vacuum suction. The holding strength provided by this always-on vacuum suction is set to be less than the joining strength between the circuit board 6 and the semiconductor chips 1 in the mounting of the semiconductor chips 1 on the circuit board 6, and to be greater than the adhesive strength of the adhesive sheet 4 whose adhesive strength has been reduced. Consequently, there is no need to perform control related to switching the vacuum suction on and off, affording a simpler configuration.

In the first embodiment, the holding strength of the head 14 is provided by always-on vacuum suction, but this is not the only option, and the holding strength can be varied as needed depending on the configuration of the head. For instance, the configuration can be such that vacuum suction is turned only when holding a semiconductor chip or the like, and turned off at other times. Also, as a configuration in which pressure-sensitive adhesion is imparted to the distal end face of the head, the holding strength of this adhesion can be less than the joint strength between the circuit board 6 and the semiconductor chips 1 in the mounting of the semiconductor chips 1 on the circuit board 6, and greater than the adhesive strength of the adhesive sheet 4 whose adhesive strength has been reduced.

In the first embodiment, the adhesive strength of the adhesive film 3 is reduced by heating the adhesive film 3 of the adhesive sheet 4 to a specific temperature in the adhesive strength reduction step, but this is not necessarily the only option, and the configuration can be varied as needed. For example, the adhesive strength of the adhesive film 3 can be reduced by irradiating the adhesive film 3 of the adhesive sheet 4 with ultraviolet light or laser light. Here again, the temperature of the semiconductor chips 1 and the adhesive sheet 4 is controlled to a specific temperature, which is the above-mentioned "temperature at which bumps can be joined" in the adhesive strength reduction step.

Mounting Device

A mounting device in the first embodiment of the present invention will now be described through reference to FIGS. 3 and 4. FIG. 3 is a diagram illustrating the mounting device in the first embodiment of the present invention. FIG. 4 is a diagram illustrating a head portion of the mounting device in the first embodiment of the present invention. FIGS. 5A and 5B are diagrams illustrating the adjustment of the parallelism of the head of the mounting device in the first embodiment of the present invention.

As shown in FIG. 3, the mounting device 50 according to the first embodiment of the present invention comprises a carrier substrate holder 11, a dual-view optical system 12, the mounting table 13, the head 14, and the adhesive sheet holder 17, and also comprises a carrier substrate remover, an adhesive strength reducer, and a controller, which are not depicted. The carrier substrate holder 11 is configured to be able to hold three carrier substrates 2, and can hold either one each of three different types of carrier substrates 2 or three carrier substrates 2 of the same type, and holds them with the second faces of the semiconductor chips 1 facing down. For example, in the case of micro LEDs, carrier substrates holding red, green, and blue LEDs can be held, or three carrier substrates holding blue LEDs can be held.

The mounting table 13 can hold the circuit board 6 in place with vacuum suction. The adhesive sheet holder 17 is provided adjacent to the mounting table 13. The adhesive sheet 4 for adhering the semiconductor chips 1 can be held by vacuum suction to the adhesive sheet holder 17. The carrier substrate holder 11, the mounting table 13, and the adhesive sheet holder 17 are configured to be able to move in both the X and Y directions.

As shown in FIG. 3, the head 14 is configured to be able to move in the Z, θ, xφ, and yφ directions, picks up the carrier substrates 2 from the carrier substrate holder 11, places the semiconductor chips 1, with the second faces facing down, on the adhesive sheet 4 held by the adhesive sheet holder 17 to adhere the semiconductor chips 1 to the adhesive sheet 4, and then after the adhesive strength of the adhesive film 3 of the adhesive sheet 4 held by the adhesive sheet holder 17 has been reduced, picks up the semiconductor chips 1 again and mounts them on the circuit board 6 in conjunction with the movement in the Z and θ directions of the head 14 and the movement in the X and Y directions of the mounting table 13. Movement of the head 14 in the xφ and yφ directions is executed in the course of parallelism adjustment (discussed below).

In the first embodiment, the head 14 moves in the Z, θ, xφ, and yφ directions, and the carrier substrate holder 11, the mounting table 13, and the adhesive sheet holder 17 move in the X and Y directions, but this is not necessarily the only option, and the configuration can be varied as needed according to the device. For instance, the head 14 can move in the X, Y, θ, xφ, and yφ directions, and the carrier substrate holder 11, the mounting table 13, and the adhesive sheet holder 17 can move in the Z direction. Also, the mechanism for movement in the θ, xφ, and yφ directions can be omitted if not necessary. For example, if there is no rotational offset in the positions of the semiconductor chips 1 and the circuit board 6, the mechanism for movement in the θ direction can be omitted. Also, if there is no need to adjust the parallelism between the semiconductor chips 1 and the circuit board 6, the mechanism for movement in the xφ and yφ directions can be omitted.

The dual-view optical system 12 go in between the head 14 and the carrier substrate 2 when the carrier substrate 2 is picked up to capture images of both. The positions of semiconductor chips 1 on the adhesive sheet holder 17 are imaged during pickup of the semiconductor chips 1, and when the semiconductor chips 1 picked up by the head 14 are mounted on the circuit board 6 resting on the mounting table 13, an image of the semiconductor chips 1 and the circuit board 6 can be captured by moving the dual-view optical system 12 in between the head 14 and the mounting table 13. The captured images are subjected to image processing by a controller (not shown), and positional deviation of each is recognized. In consideration of this positional deviation, the controller performs control such that the head 14 holds the semiconductor chips 1, separates them from the adhesive sheet 4, and joins the second face side of the semiconductor chips 1 to the circuit board 6.

The carrier substrate remover (not shown) is configured to include a laser beam emitter capable of irradiating the carrier substrates 2 with laser light. The carrier substrates and the semiconductor chips 1 can be easily separated by irradiating the carrier substrates 2 with laser light from this laser beam emitter. In the case of micro LEDs, for example, when carrier substrates composed of sapphire are irradiated with an excimer laser, the sapphire can be readily separated from the micro LEDs.

The adhesive strength reducer (not shown) is configured to include a heater for heating the adhesive sheet 4 and the semiconductor chips 1 to a specific temperature. More specifically, a heater 21 provided to the adhesive sheet holder 17 can heat the adhesive sheet 4 and the semiconductor chips 1 to a specific temperature at which the adhesive strength of the adhesive film 3 is substantially reduced to zero.

In the mounting of the semiconductor chips 1 on the circuit board 6, positional deviation of the semiconductor chips 1 and the circuit board 6 is imaged by the dual-view optical system 12, such that the chips are mounted accurately in the X and Y directions. With the mounting device according to the first embodiment, in addition to accuracy in the X and Y directions, the parallelism between the semiconductor chips 1 and the circuit board 6 is adjusted, which affords good accuracy in the Z direction.

This parallelism adjustment will be described through reference to FIGS. 4 to 5B. As shown in FIG. 4, a first laser displacement gauge 15, a second laser displacement gauge 16, and a third laser displacement gauge (not shown) are provided at both ends of the head 14. The circuit board 6 is irradiated with laser light from these three laser displacement gauges, the distance from each one to the circuit board 6 is measured, the differences between these distances is calculated by the controller, and the head 14 is moved for adjustment in the and yφ directions (See FIGS. 4 and 5B).

Also, prior to adjustment in the xφ and yφ directions, it is necessary to adjust the parallelism of the head 14 itself. As shown in FIG. 5A, the head 14 chucks a jig 31, which is formed as being flat, laser light is emitted to the jig 31 from the first laser displacement gauge 15, the second laser displacement gauge 16, and the third laser displacement gauge (not shown), the parallelism of the head itself is measured, and the head itself is moved in the xφ and directions for adjustment.

The mounting device 50 described above allows the mounting method according to the first embodiment of the present invention to be executed. Numerous semiconductor chips can be stably mounted on the circuit board at a high speed and with high accuracy by mounting them on the circuit board 6 while maintaining the temperature to which the semiconductor chips 1 and the circuit board 6 have been heated.

The first embodiment has a configuration in which a carrier substrate remover is provided to the mounting device 50, but this is not necessarily the only option, and appropriate changes can be made according to the mounting device. For example, the configuration can have two devices, namely, a carrier substrate removing device and a mounting device 51 that has no carrier substrate remover. In other words, a carrier substrate removing device is provided at a step ahead of the mounting device 51, and the adhesive substrate affixation step and the carrier substrate removal step are executed by this carrier substrate removing device. The configuration can also be such that the semiconductor chips 1 from which the carrier substrate has been removed by the carrier substrate removing device are adhered to the adhesive sheet 4 and conveyed in this state by a conveyance means such as a robot to the adhesive sheet holder 17 in the mounting device 51. This allows the mounting device 51 to be more compact.

Thus, in the first embodiment, the adhesive strength of an adhesive sheet is reduced and then a semiconductor chip is held and mounted by a head in a mounting method in which a diced semiconductor chip whose first face is held on a carrier substrate is mounted on a circuit board that has been placed on a mounting table, the method comprising the sequential execution of an adhesive sheet affixation step of affixing a second face, which is a face of the semiconductor chip on the opposite side from the first face held on the carrier substrate, to an adhesive sheet; a carrier substrate removal step of removing the carrier substrate from the semiconductor chip; an adhesive strength reduction step of reducing the adhesive strength of the adhesive sheet; and a mounting step of mounting the semiconductor chip on the circuit board by holding the first face side of the semiconductor chip with a head to separate the semiconductor chip from the adhesive sheet, and joining the second face side to the circuit board. Therefore, the semiconductor chip can be mounted without anything unnecessary remaining on it, and it can be mounted stably and accurately on the circuit board.

Also, the adhesive strength of an adhesive sheet is reduced and then a semiconductor chip is held and mounted by a head in a mounting device with which a diced semiconductor chip whose first faces is held on a carrier substrate is mounted on a circuit board that has been placed on a mounting table, the device comprising an adhesive sheet holder that holds an adhesive sheet to which a second face of the semiconductor chip held on the carrier substrate, which is a face on the opposite side from the first face, is affixed; a carrier substrate remover that removes the carrier substrate from the semiconductor chip affixed to the adhesive sheet; an adhesive strength reducer that reduces the adhesive strength of the adhesive sheet; a head capable of holding the semiconductor chip from the first face side; and a controller that performs control such that the head holds the semiconductor chip to separate the semiconductor chip from the adhesive sheet, and joins the second face side to the circuit board. Therefore, the semiconductor chip can be mounted without anything unnecessary remaining on it, and it can be mounted stably and accurately on the circuit board.

Second Embodiment

A second embodiment of the present invention differs from the first embodiment in that a head 114 that picks up the semiconductor chips 1 from the adhesive sheet 4 whose adhesive strength has been reduced picks up the semiconductor chips 1 one at a time. Just as with the head 14 in the first embodiment, the head 114 comprises a heating component comprising a heater 122.

Figure 6A:
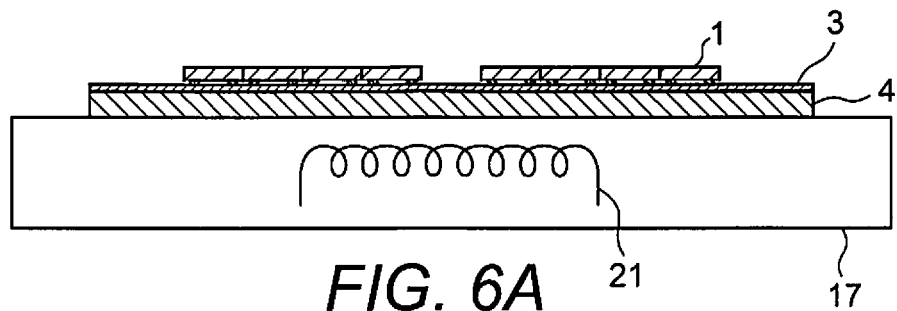
FIGS. 6A, 6B and 6C are diagrams illustrating the second half of a mounting method in a second embodiment of the present invention.
Figure 6B:
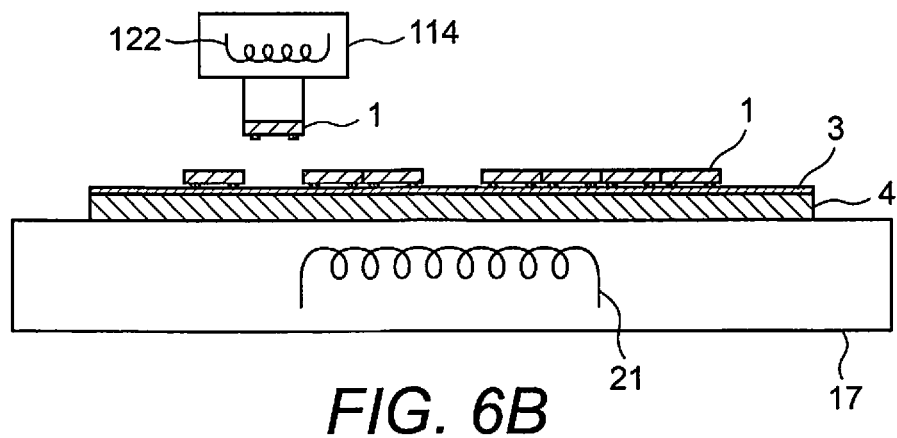
Figure 6C:
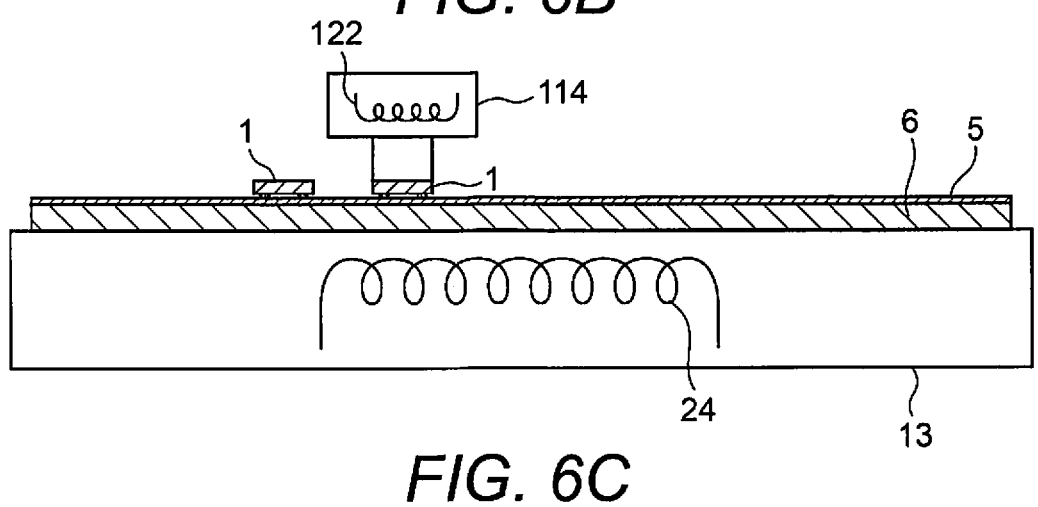

The mounting method in the second embodiment of the present invention will be described through reference to FIGS. 6A to 6C. FIGS. 6A, 6B and 6C are diagrams illustrating the second half of a mounting method in the second embodiment of the present invention. The first half of the mounting method in the second embodiment is the same as in the first embodiment. In the second half of the mounting method in the second embodiment, the adhesive strength reduction step shown in FIG. 6A is executed as in the first embodiment. In the adhesive strength reduction step, the adhesive strength of the adhesive film 3 of the adhesive sheet 4 is reduced by heating the adhesive film 3 to a specific temperature. This specific temperature can be selected as needed, such as 90° C., 150° C., or 180° C., by selecting the type of the adhesive film 3. The second embodiment also makes use of an adhesive sheet 4 that includes an adhesive film 3 whose adhesive strength drops substantially to zero at 150° C. That is, heating the adhesive sheet 4 to 150° C. reduces the adhesive strength of the adhesive film 3, allowing the semiconductor chips 1 to be easily separated. When heating the adhesive sheet 4, the heater 21 in the adhesive sheet holder 17 is controlled such that the semiconductor chips 1 are also heated to 150° C., which is the same specific temperature. This is because, just as in the first embodiment, if the same temperature as the 150° C. temperature when joining the semiconductor chips 1 to the circuit board 6 in the mounting step is also employed as the specific temperature in the adhesive strength reduction step, then the temperature of the semiconductor chips 1 will be kept constant from the adhesive strength reduction step to the mounting step, and thermal contraction will be avoided. This affords stable, accurate mounting.

Next, as shown in FIG. 6B, the semiconductor chips 1 on the adhesive sheet 4 are chucked and picked up one by one by the head 114. At this time, the temperature of the picked-up semiconductor chip 1 is controlled by the heater 122 provided inside the head 114 so as to be maintained at a specific temperature in the adhesive strength reduction step, that is, the temperature is also head at 150° C. in the second embodiment. The heater 21 in the adhesive sheet holder 17 is similarly controlled such that the temperature of the semiconductor chip 1 is maintained at a specific temperature in the adhesive strength reduction step, that is, the temperature is also held at 150° C. in the second embodiment.

As shown in FIG. 6C, one semiconductor chip 1 picked up by the head 114 moves as needed in the X, Y, and Z directions to be joined to and mounted on the circuit board 6 held on the mounting table 13. A transfer layer 5 is provided on the surface of the circuit board 6, and the semiconductor chips 1 can be held by this transfer layer 5 so as not to move. The mounting table 13 is provided with a heater 24, and the bumps provided to the semiconductor chips 1 and the electrodes of the circuit board 6 are joined by controlling the heating of the mounting table 13 together with the head 114. Controlling the heating of the head 114 and the mounting table 13 keeps the semiconductor chips 1 at a specific temperature in the adhesive strength reduction step, which is 150° C. again in the second embodiment, also keeps the circuit board 6 at this specific temperature in the adhesive strength reduction step, and keeps the semiconductor chips 1 at this specific temperature from the adhesive strength reduction step to the mounting step. This keeps the semiconductor chips 1 from undergoing thermal contraction, and allows them to be mounted stably and accurately.

The mounting method in the second embodiment is particularly effective when, for example, the semiconductor chips 1 mounted on the circuit board 6 are misaligned or cannot be mounted. Repair can be easily performed by picking up the semiconductor chips 1 one by one and mounting them on the circuit board 6. Here again, keeping the temperature of the semiconductor chips 1 at a specific temperature from the adhesive strength reduction step to the mounting step prevents thermal contraction of the semiconductor chips 1 and allows them to be mounted stably and accurately.

Third Embodiment

A third embodiment of the present invention differs from the first and second embodiments in that the semiconductor chips 1 are pressed in order to prevent the semiconductor chips 1 from scattering due to the reduction in the adhesive strength of the adhesive sheet 4 in the adhesive strength reduction step.

Figure 7:
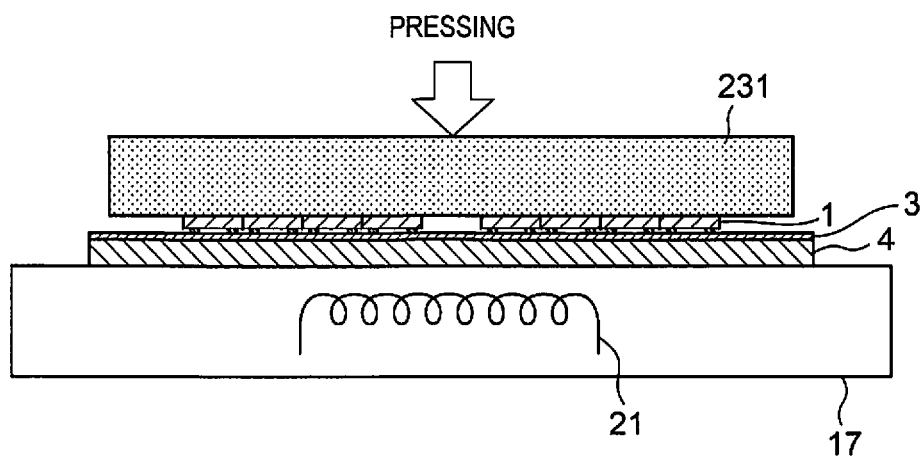
FIG. 7 is a diagram illustrating the adhesive strength reduction step in a third embodiment of the present invention.

The third embodiment of the present invention will be described through reference to FIG. 7. FIG. 7 is a diagram illustrating the adhesive strength reduction step in the third embodiment of the present invention. In the third embodiment, as shown in FIG. 7, a mounting device 50 is provided with a pressing component 231, and can be pressed and moved in the Z direction by a drive mechanism (not shown). In the adhesive strength reduction step, the pressing component 231, which has been heated to the specific temperature in the adhesive strength reduction step described in the first embodiment, presses on the semiconductor chips 1 held by the adhesive sheet 4, the semiconductor chips 1 and the adhesive sheet 4 are heated by the heating of the adhesive sheet holder 17, and once they have equalized to the specific temperature, the pressing is continued until the adhesive strength of the adhesive sheet 4 is reduced, and as a result, the reduction in the adhesive strength of the adhesive sheet 4 does not cause any misalignment due to scattering of the semiconductor chips 1. The pressing component 231 can be made of a metal such as iron or aluminum, a plastic, or any other material desired, and is large enough to be able to press all of the semiconductor chips 1 on the adhesive sheet 4. Upon completion of the adhesive strength reduction step, the pressing component 231 releases its pressure and is raised.

Thus, in the third embodiment, positional deviation of the semiconductor chips due to the reduction of the adhesive strength of the adhesive sheet 4 in the adhesive strength reduction step can be prevented, and the mounting step, which is a subsequent step, can be carried out more smoothly, which affords more stable mounting.

Fourth Embodiment

Figure 8A:
FIGS. 8A, 8B and 8C are diagrams illustrating a first adhesive member affixation step and a carrier substrate removal step in a fourth embodiment of the present invention.
Figure 8B:
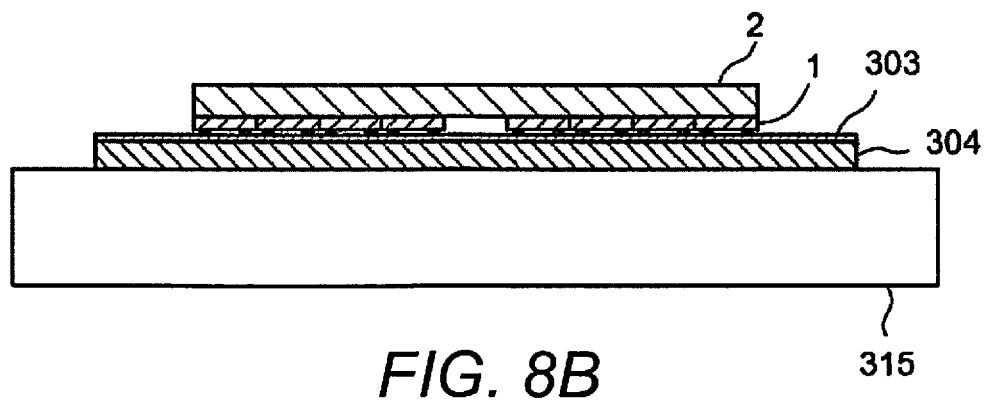
Figure 8C:
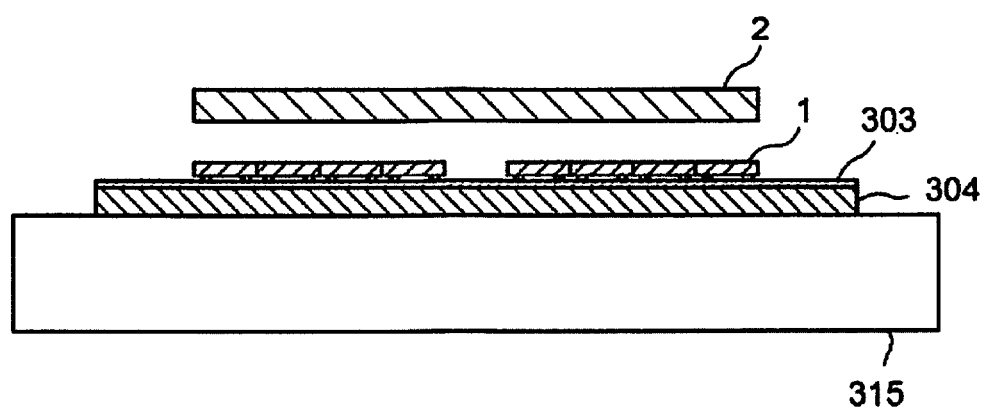
Figure 9A:
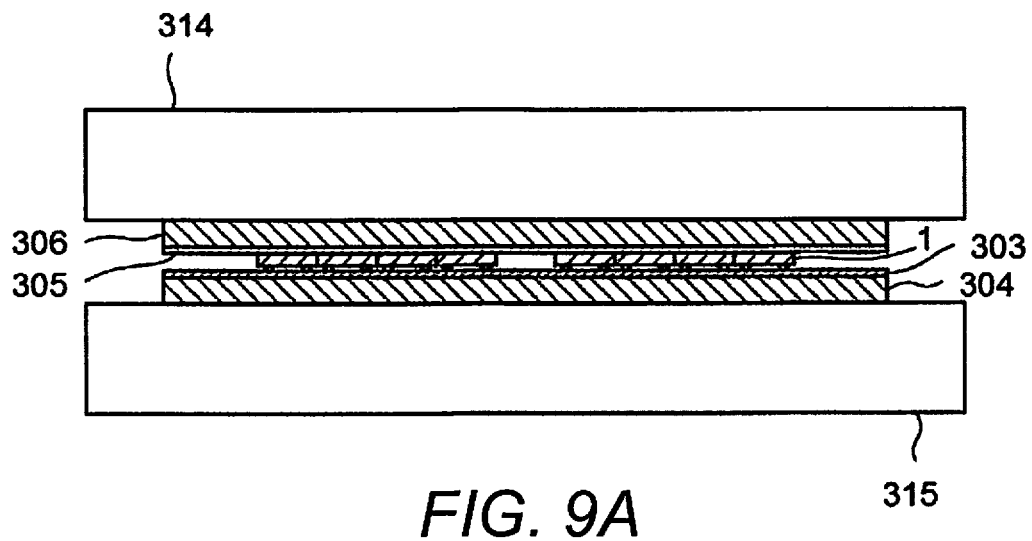
FIGS. 9A and 9B are diagrams illustrating a second adhesive member affixation step and a first adhesive strength reduction step in the fourth embodiment of the present invention.
Figure 9B:
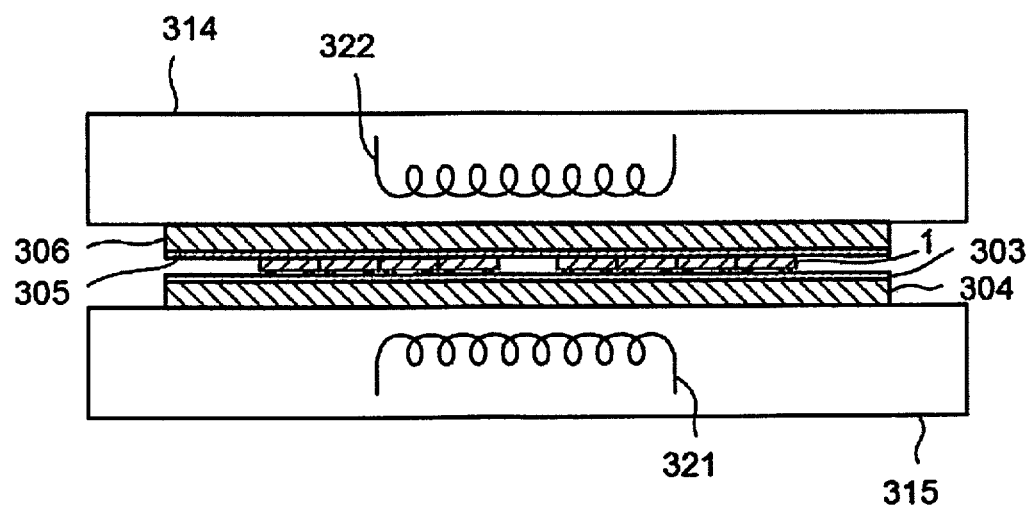
Figure 10A:
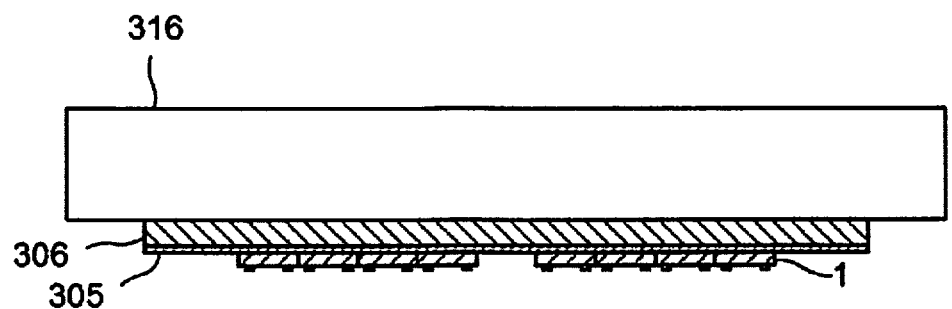
FIGS. 10A and 10B are diagrams illustrating a third adhesive member affixation step in the fourth embodiment of the present invention.
Figure 10B:
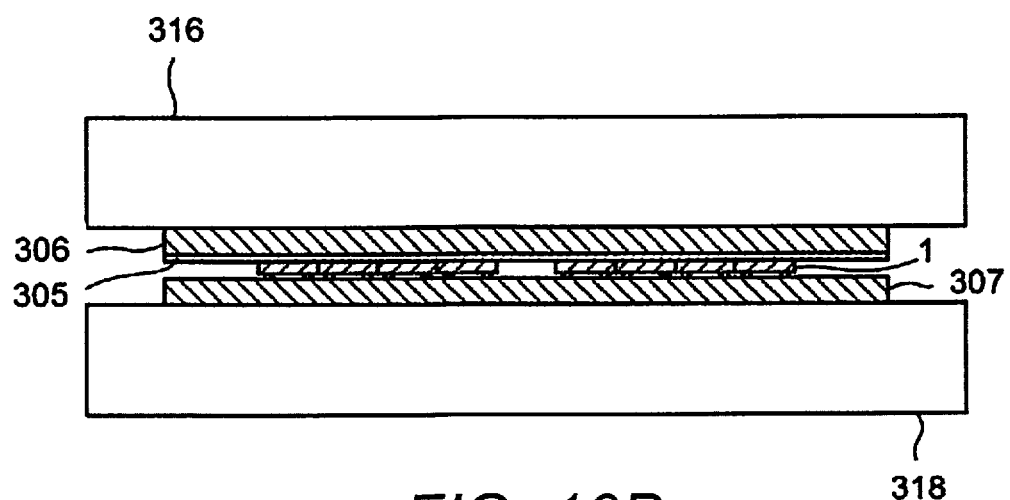
Figure 11A:
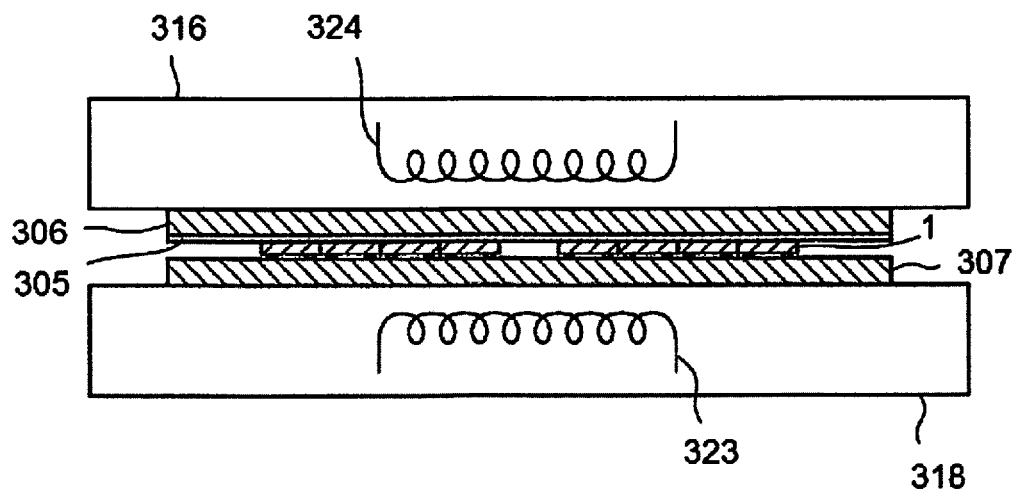
FIGS. 11A and 11B are diagrams illustrating a second adhesive strength reduction step in the fourth embodiment of the present invention.
Figure 11B:
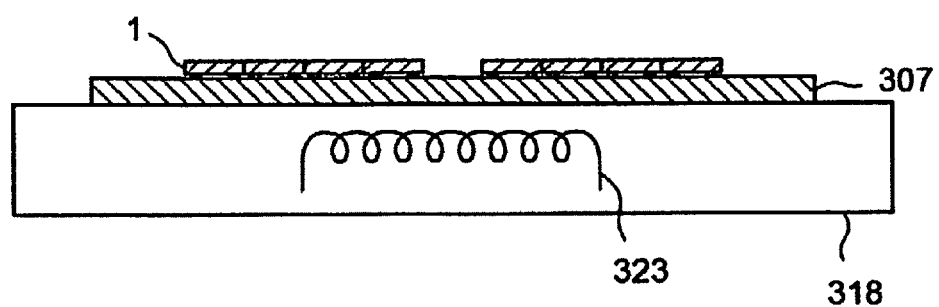
Figure 12A:
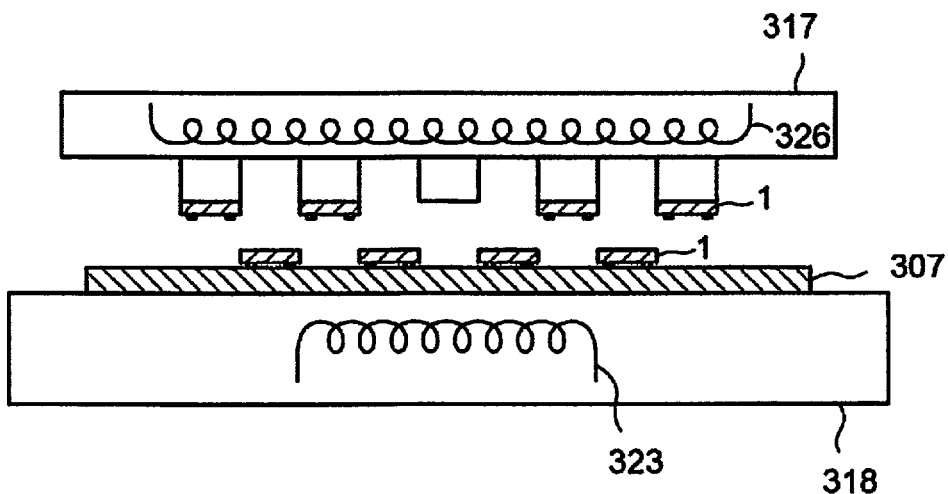
FIGS. 12A and 12B are diagrams illustrating a mounting step in the fourth embodiment of the present invention.
Figure 12B:
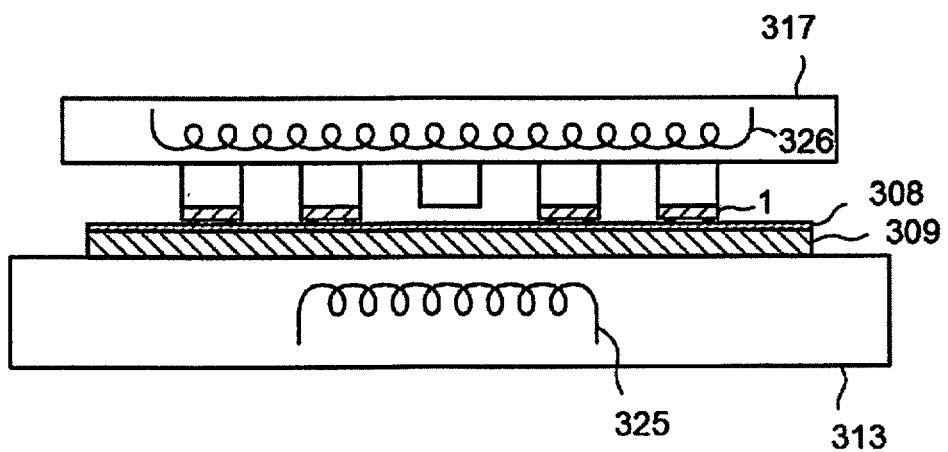
Figure 13:
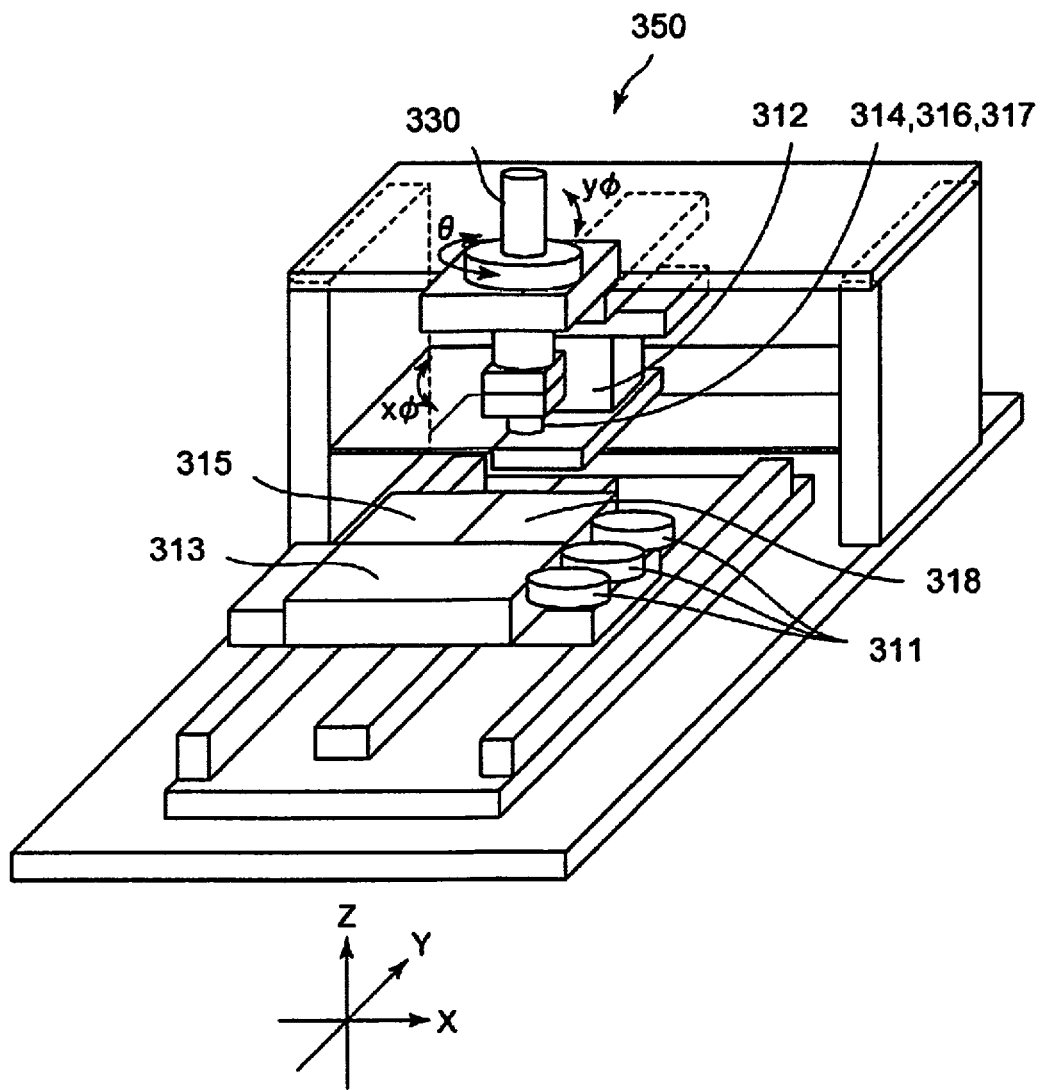
FIG. 13 is a diagram illustrating a mounting device in the fourth embodiment of the present invention.

A fourth embodiment of the present invention will be described through reference to FIGS. 8A to 13. FIGS. 8A, 8B and 8C are diagrams illustrating a first adhesive member affixation step and a carrier substrate removal step in the fourth embodiment of the present invention. FIGS. 9A and 9B are diagrams illustrating a second adhesive member affixation step and a first adhesive strength reduction step in the fourth embodiment of the present invention. FIGS. 10A and 10B are diagrams illustrating a third adhesive member affixation step in the fourth embodiment of the present invention. FIGS. 11A and 11B are diagrams illustrating a second adhesive strength reduction step in the fourth embodiment of the present invention. FIGS. 12A and 12B are diagram illustrating a mounting step in the fourth embodiment of the present invention. FIG. 13 is a diagram illustrating a mounting device in the fourth embodiment of the present invention.

In the present invention, of the two main faces of the semiconductor chips, the face held by the carrier substrate is defined as the first face, the face on the opposite side from the first face is defined as the second face, and it is assumed bumps are formed on the second face.

Mounting Method

First, the steps of the mounting method in the fourth embodiment of the present invention will be described through reference to FIGS. 8A to 12B. FIG. 8A shows a plurality of diced semiconductor chips 1 whose first faces are held on the carrier substrate 2.

FIG. 8B shows the first adhesive member affixation step, in which the second face of the semiconductor chips 1, which is the face on the opposite side from the first face that is held on the carrier substrate 2, is affixed to a first adhesive member 304. The first adhesive member 304 is held by vacuum suction to a first adhesive member holder 315, and a first adhesive film 303 is formed on the face to which the semiconductor chips 1 are affixed. The first adhesive film 303 in the fourth embodiment usually has high adhesive strength, but it has a property whereby its adhesive strength is reduced by heating to a first specific temperature (see below). In this first adhesive member affixation step, the carrier substrate 2 holding the semiconductor chips 1 is chucked and conveyed by a first transfer head 314 (discussed below), and the second faces of the semiconductor chips 1 are affixed on the first adhesive film 303 of the first adhesive member 304 held by the first adhesive member holder 315.

Next, as shown in FIG. 8C, the carrier substrate removal step is executed. In the carrier substrate removal step, the carrier substrate 2 is separated and removed from the semiconductor chips 1 by laser liftoff. The separated carrier substrate 2 is chucked and removed by the first transfer head 314.

In the fourth embodiment, the carrier substrate 2 is irradiated with a laser beam in the carrier substrate removal step, and the carrier substrate 2 is separated from the semiconductor chips 1 by laser liftoff, but this is not necessarily the only option, and the method can be changed as needed. For instance, back grinding can be used.

After this, the second adhesive member affixation step shown in FIG. 9A is executed. In the second adhesive member affixation step, a second adhesive member 306, which has a second adhesive film 305 formed on its surface, is chucked, held, and conveyed by the first transfer head 314, and the second adhesive film 305 side of the second adhesive member 306 is pressed against and affixed to the first faces of the semiconductor chips 1 whose second faces are held by the first adhesive film 303 of the first adhesive member 304 held on the first adhesive member holder 315. This results in a state in which the semiconductor chips 1 are sandwiched between the first adhesive member 304 and the second adhesive member 306.

Here, as described above, the first adhesive film 303 of the first adhesive member 304 normally has high adhesive strength, but has a property whereby its adhesive strength is reduced by heating to a first specific temperature (approximately 90° C. in the fourth embodiment), with the adhesive strength dropping substantially to zero. Also, the second adhesive film 305 of the second adhesive member 306 normally has high adhesive strength, but has a property whereby its adhesive strength is reduced by heating to a second specific temperature (approximately 150° C. in the fourth embodiment), with the adhesive strength dropping substantially to zero. Therefore, when the semiconductor chips 1 are heated to the first specific temperature in a state of being sandwiched between the first adhesive member 304 and the second adhesive member 306 as in the first adhesive strength reduction step (discussed below), the adhesive strength of the first adhesive film 303 decreases substantially to zero, and as a result the state in which the semiconductor chips 1 are separated from the first adhesive member 304 and held by the second adhesive member 306 continues. Also, when the second adhesive member 306 is heated to the second specific temperature, the adhesive strength of the second adhesive film 305 decreases substantially to zero, so the second adhesive member 306 separates from the semiconductor chips 1.

In the fourth embodiment, the first adhesive member 304 having a first specific temperature of approximately 90° C. is employed, and the second adhesive member 306 having a second specific temperature of approximately 150° C. is employed, but this is not necessarily the only option, and the temperature characteristics can be varied as needed. For example, a first adhesive member 304 having a first specific temperature of about 60° C. can be employed, and a second adhesive member 306 having a second specific temperature of about 120° C. can be employed, or adhesive members having a property whereby their adhesive strength decreases at some other temperature can be employed. What is important is that the adhesive members be configured such that a second specific temperature at which the adhesive strength of the second adhesive member 306 decreases is higher than a first specific temperature at which the adhesive strength of the first adhesive member 304 decreases. It is preferable here for the difference between the first specific temperature and the second specific temperature to be about 60° C. With this configuration, the first adhesive member 304 is heated to the first specific temperature to reduce its adhesive strength, and the second adhesive member 306 is heated to a second specific temperature higher than the first specific temperature to reduce its adhesive strength.

Here, the first adhesive member 304 normally (at a temperature lower than the first specific temperature) has high adhesive strength, and the second adhesive member 306 normally (at a temperature lower than the second specific temperature) has high adhesive strength. This prevents the semiconductor chips 1 that are adhered with this high adhesive strength from being out of position or in the wrong orientation. In particular, the laser liftoff in the carrier substrate removal step is quite powerful, and a weak adhesive strength that would allow easy pickup of the semiconductor chips 1 with the head cannot withstand the power of the laser, so an adhesive member with high adhesive strength is employed.

Next, as shown in FIG. 9B, the first adhesive strength reduction step is executed. In the first adhesive strength reduction step, a first adhesive member heating mechanism 321 of the first adhesive member holding unit 315 and a first transfer head heating mechanism 322 of the first transfer head 314 control the heating such that the first adhesive member 304 and the second adhesive member 306 will be at a first specific temperature (approximately 90° C.), which reduces the adhesive strength of the first adhesive film 303. At this point, the second adhesive film 305 of the second adhesive member 306 is also heated to the first specific temperature, but since the temperature at which the adhesive strength of the second adhesive film 305 decreases is the second specific temperature (approximately 150° C.), the adhesive strength does not decrease at the first specific temperature, and the second adhesive member 306 keeps the semiconductor chips 1 adhered with the second adhesive film 305.

Then, as shown in FIGS. 10A and 10B, the third adhesive member affixation step is executed. First, the semiconductor chips 1 whose first faces are held on the second adhesive member are picked up by the second transfer head 316 (see FIG. 10A) and conveyed to a third adhesive member holder 318, and the second faces of the semiconductor chips 1 are affixed over the third adhesive member 307 held by the third adhesive member holder 318 (see FIG. 10B). The semiconductor chips 1 are in a state of being sandwiched between the third adhesive member 307 and the second adhesive member 306. The third adhesive member 307 is made of a silicone resin or the like, and has lower adhesive strength than the first adhesive member 304 described above. That is, although the adhesive strength of the first adhesive member 304 decreases at the first specific temperature, its adhesive strength is high at temperatures lower than this, so the adhered semiconductor chips 1 cannot be easily picked up.

Therefore, the semiconductor chips 1 are adhered to the third adhesive member 307, which always has a lower adhesive strength than the first adhesive member 304, making it possible to easily pick up the semiconductor chips 1 in the mounting step discussed below.

As described above, in the carrier substrate removal step of removing the carrier substrate 2 from the semiconductor chips 1 by laser liftoff, the laser is so powerful that any member having low adhesive strength, such as the third adhesive member 307, will not withstand this power very well. Therefore, the power of the excimer laser is borne by the first adhesive member 304 having the first adhesive film 303, which normally has high adhesive strength.

Next, as shown in FIGS. 11A and 11B, the second adhesive strength reduction step is executed. In the second adhesive strength reduction step, a third adhesive member heating mechanism 323 of the third adhesive member holder 318 and a second transfer head heating mechanism 324 of the second transfer head 316 control the heating such that the third adhesive member 307 and the second adhesive member 306 will be at a second specific temperature (approximately 150° C.) along with the semiconductor chips 1. This reduces the adhesive strength of the second adhesive film 305 in the second adhesive member 306 to substantially zero (see FIG. 11A). When the second adhesive member 306 is separated from the semiconductor chips 1, and the second transfer head 316 is pulled away from the third adhesive member holder 318 along with the second adhesive member 306, the semiconductor chips 1 remain on the third adhesive member 307 on the third adhesive member holder 318 (see FIG. 11B). At this point, the second face side of the semiconductor chips 1 is adhered to the third adhesive member 307.

Gas can be generated from the first adhesive film 303 and the second adhesive film 305 in the first adhesive strength reduction step and the second adhesive strength reduction step, resulting in foaming. If that happens, the foaming can cause the semiconductor chips 1 adhered to each adhesive film to be out of position or in the wrong orientation. However, as described above, in the first adhesive strength reduction step, the semiconductor chips 1 are held by the second adhesive member, whose adhesive strength does not decrease at the first specific temperature, and in the second adhesive strength reduction step, the semiconductor chips 1 are held by the third adhesive member 307, which prevents the semiconductor chips 1 from being out of position or in the wrong orientation.

Here, the second specific temperature is set to a temperature at which the bumps can be joined in the mounting step (discussed below). That is, from the second adhesive strength reduction step to the mounting step, the semiconductor chips 1 are maintained at the second specific temperature, thus preventing mounting position deviation due to thermal expansion and contraction. More specifically, the heating of the third adhesive member heating mechanism 323 of the third adhesive member holder 318 and the second transfer head heating mechanism 324 of the second transfer head 316 in the second adhesive strength reduction step, and of the mounting head heating mechanism 325 of the mounting table 313 and the mounting head heating mechanism 326 of the mounting head 317 in the mounting step (discussed below) are controlled so as to maintain the semiconductor chips 1 at the second specific temperature.

That is, the temperature at which the bumps can be joined is around 150° C., and the second adhesive member 306 makes use of a second adhesive film 305 whose adhesive strength is substantially zero at this temperature. In other words, by using the second adhesive member 306 that features a second adhesive film 305 having a second specific temperature of approximately 150° C., and heating the second adhesive member 306 to approximately 150° C., the second adhesive film 305 also reaches approximately 150° C. and its adhesive strength is reduced, making it possible for the semiconductor chips 1 to be easily separated. Also, the third adhesive member heating mechanism 323 of the third adhesive member holding unit 318 and the second transfer head heating mechanism 324 of the second transfer head 316 are controlled such that the semiconductor chips 1 are also heated to about 150° C., which is the same second specific temperature, during the heating of the second adhesive member 306. Thus employing a temperature that is the same as the temperature at which the bumps can be joined in the joining of the semiconductor chips 1 to the circuit board 309 in the mounting step (discussed below) as the second specific temperature in the second adhesive strength reduction step as well makes it possible to keep the temperature of the semiconductor chips 1 constant from the second adhesive strength reduction step to the mounting step, avoids expansion and contraction, and affords stable mounting with high accuracy.

Finally, the mounting step is executed, as shown in FIGS. 12A and 12B. In the mounting step, as shown in FIG. 12A, first a plurality of the semiconductor chips 1 on the third adhesive member holder 318 are chucked and picked up at the same time by the mounting head 317. The number of semiconductor chips 1 to be picked up can be set as desired according to the configuration of the mounting head 317, but it is preferable to pick up as many semiconductor chips 1 as possible in order to achieve high-speed mounting. In the fourth embodiment, the mounting head 317 is configured such that 10,000 semiconductor chips 1 can be picked up. In this pickup, the temperature of the semiconductor chips 1 picked up by the mounting head heating mechanism 326 provided inside the mounting head 317 is controlled to be at the second specific temperature in the second adhesive strength reduction step, that is, a temperature at which bumps can be joined (150° C. in the fourth embodiment). The third adhesive member heating mechanism 323 of the third adhesive member holder 318 similarly maintains the temperature of the semiconductor chips 1 at the second specific temperature in the second adhesive strength reduction step, that is, a temperature at which bumps can be joined (about 150° C. in the fourth embodiment). The pitch at which the semiconductor chips 1 are picked up by the mounting head 317 is configured to match the pitch at which the semiconductor chips 1 are to be mounted on the circuit board 309. Here, "the temperature at which the bumps can be joined" is a temperature suited to joining the bumps provided on the semiconductor chips 1 to the electrodes of the circuit board 309. At this temperature, the bumps are sticky and suitable for joining, but below this temperature no stickiness occurs, and above this temperature the bumps are oxidized and not suitable for joining.

As shown in FIG. 12B, the semiconductor chips 1 picked up by the mounting head 317 are mounted on the circuit board 309 held on the mounting table 313 by appropriately moving the mounting head 317 or the mounting table 313 in the X, Y, and Z directions. The circuit board 309 in the fourth embodiment has a circuit formed on the surface of glass. In order to mount 10,000 semiconductor chips 1 all at once on the circuit board 309, the circuit board 309 and the semiconductor chips 1 not only need to be positioned in the X and Y directions with high accuracy, but the parallelism between them also needs to be adjusted. Therefore, by adjusting the parallelism between the mounting head 317 and the mounting table 313 in the mounting device 350, all of the semiconductor chips 1 can be mounted by moving them by the same height (in the Z direction). A transfer layer 308 is provided on the surface of the circuit substrate 309, and this transfer layer 308 can hold the semiconductor chips 1 such that they do not move.

The mounting table 313 is provided with a mounting table heating mechanism 325, and the heating of the mounting table 313 together with the mounting head 317 is controlled to a temperature at which bumps can be joined, such that the bumps provided to the semiconductor chips 1 are joined to the electrodes of the circuit board 309 (see FIG. 12B). Controlling the heating of the mounting head 317 and the mounting table 313 maintains the semiconductor chips 1 at the second specific temperature in the second adhesive strength reduction step, that is, a temperature at which the bumps can be joined (approximately 150° C. in the fourth embodiment), also maintains the circuit board 309 at the second specific temperature in the second adhesive strength reduction step, and maintains not only the semiconductor chips 1 but also the circuit board 309, the second adhesive member 306, the second transfer head 316, the mounting head 317, and the transfer table 313 at the same second specific temperature from the second adhesive strength reduction step to the mounting step. This prevents the semiconductor chips 1 and the circuit board 309 from undergoing thermal expansion and contraction, and allows accurate mounting to be stably performed.

In the mounting step, the configuration is such that the joint strength between the circuit board 309 and the semiconductor chips 1 in the mounting of the semiconductor chips 1 on the circuit board 309 is higher than the holding strength of the mounting head 317, and the holding strength of the mounting head 317 is higher than the adhesive strength of the third adhesive member 307. That is, the mounting head 317 is always providing vacuum suction, and holds the semiconductor chips 1 with this vacuum suction. The holding strength produced by this constant vacuum suction is set to be less than the adhesive strength between the circuit board 309 and the semiconductor chips 1 in the mounting of the semiconductor chips 1 on the circuit board 309, and higher than the adhesive strength of the third adhesive member 307. Consequently, there is no need to perform control relating to switching the vacuum suction on and off, which affords a simpler configuration.

In the fourth embodiment, the holding strength of the mounting head 317 is produced by constant vacuum suction, but this is not necessarily the only option, and can be varied as needed depending on the configuration of the device. For instance, the configuration can be such that vacuum suction is switched on only when holding the semiconductor chips 1, and is switched off at other times. Also, the configuration in which the distal end face of the mounting head 317 is adhesive can be such that the holding strength produced by this pressure-sensitive adhesion is less than the adhesive strength between the circuit board 309 and the semiconductor chips 1 during mounting, is higher than the adhesive strength of the third adhesive member 307.

In the fourth embodiment, the adhesive strength is reduced by heating the adhesive films of the adhesive sheets to specific temperatures in the first adhesive strength reduction step and the second adhesive strength reduction step, but this is not necessarily the only option, and the configuration can be varied as needed according to circumstances. For instance, the adhesive film of an adhesive member can be irradiated with ultraviolet light or laser light to reduce the adhesive strength of the adhesive film. Here again, in the second adhesive strength reduction step, the temperature of the semiconductor chips 1 and the second adhesive member 306 is controlled to the second specific temperature, which is a temperature at which the bumps can be joined.

Mounting Device

A mounting device according to the fourth embodiment of the present invention will now be described through reference to FIG. 13. FIG. 13 is a diagram illustrating the mounting device in the fourth embodiment of the present invention.

As shown in FIG. 13, the mounting device 350 in the fourth embodiment of the present invention comprises a carrier substrate holder 311, a dual-view optical system 312, the mounting table 313, the first transfer head 314, the first adhesive member holder 315, the second transfer head 316, the mounting head 317, and the third adhesive member holder 318, and also comprises a carrier substrate remover (not shown), a first adhesive strength reducer, a second adhesive strength reducer, and mounting temperature controller. The carrier substrate holder 311 is configured to be able to hold three carrier substrates 2, and can hold one each of three types of carrier substrate 2, or three carrier substrates 2 of the same type, and holds them with the second faces of the semiconductor chips 1 facing down. For example, in the case of micro LEDs, carrier substrates each holding red, green, and blue LEDs can be held, or three carrier substrates each holding LEDs of one color can be held.

The mounting table 313 can hold the circuit board 309 in place with vacuum suction. The first adhesive member holder 315 and the third adhesive member holder 318 are provided at positions adjacent to the mounting table 313. The first adhesive member 304 for adhering the semiconductor chips 1 can be held by vacuum suction to the first adhesive member holder 315. The third adhesive member 307 for adhering the semiconductor chips 1 can be held to the third adhesive member holder 318. The carrier substrate holder 311, the transfer table 313, the first adhesive member holder 315, and the third adhesive member holder 318 are all configured to be able to move in the X and Y directions.

The first transfer head 314, the second transfer head 316, and the mounting head 317 are normally stored in storage components (not shown), and are automatically held by a head holder 330 when necessary. That is, the first transfer head 314, the second transfer head 316, and the mounting head 317 are held by the head holder 330 such that they can be exchanged. As shown in FIG. 13, the head holder 330 is configured to be able to move in the Z, θ, xφ, and yφ directions, the carrier substrate 2 is picked up from the carrier substrate holder 311 by the first transfer head 314, and the semiconductor chips 1 are adhered, with their second faces facing down, on the first adhesive member 304 held by the first adhesive member holder 315 and affixed to the first adhesive member 304. The second transfer head 316 picks up the semiconductor chips 1 after the adhesive strength of the first adhesive film 303 of the first adhesive member 304 held by the first adhesive member holder 315 has been reduced, and conveys and adheres the semiconductor chips 1 to the third adhesive member 307 in conjunction with the movement of the adhesive member holder 16 in the X and Y directions. Also, the semiconductor chips 1 affixed to the third adhesive member 307 can be picked up by the mounting head 317 and mounted on the circuit board 309 placed on the mounting table 313.

Here, the first adhesive member heating mechanism 321 is provided to the first adhesive member holding part 315, the first transfer head heating mechanism 322 is provided to the first transfer head 314, the third adhesive member heating mechanism 323 is provided to the third adhesive member holder 318, the second transfer head heating mechanism 324 is provided to the second transfer head 316, the transfer table heating mechanism 325 is provided to the transfer table 313, and the mounting head heating mechanism 326 is provided to the mounting head 317. These heating mechanisms are equipped with heaters and can heat to the first specific temperature or the second specific temperature.

More specifically, the first adhesive strength reducer controls the first adhesive member heating mechanism 321 provided to the first adhesive member holder 315 and the first transfer head heating mechanism 322 provided to the first transfer head 314, which allows the first adhesive member 304 and the semiconductor chips 1 to be heated to the first specific temperature at which the adhesive strength of the first adhesive film 303 decreases substantially to zero. Also, the second adhesive strength reducer controls the third adhesive member heating mechanism 323 provided to the third adhesive member holder 318 and the second transfer head heating mechanism 324 provided to the second mounting head 316, which allows the second adhesive member 306 and the semiconductor chips 1 to be heated to the second specific temperature at which the adhesive strength of the second adhesive film 305 decreases substantially to zero. Furthermore, in order to mount the semiconductor chips 1 on the circuit board 309 while maintaining the second specific temperature, the mounting temperature controller controls the third adhesive member heating mechanism 323 provided to the third adhesive member holder 318, the mounting table heating mechanism 325 provided to the mounting table 313, and the mounting head heating mechanism 326 provided to the mounting head 317, which allows the semiconductor chips 1 and the circuit board 309 to be heated to a second specific temperature suitable for joining.

In the fourth embodiment, the configuration is such that the first transfer head 314 picks up the carrier substrate 2 from the carrier substrate holder 311, the semiconductor chips 1 are adhered, with their second faces facing down, on the first adhesive member 304 held by the first adhesive member holder 315 and affixed to the first adhesive member 304, and the second transfer head 316 picks up the semiconductor chips 1 after the adhesive strength of the first adhesive film 303 of the first adhesive member 304 held by the first adhesive member holder 315 has been reduced, and affixes the semiconductor chips 1 to the third adhesive member 307, but this is not necessarily the only option, and the configuration can be appropriately modified. For instance, the first transfer head 314 and the second transfer head 316 together constitute a single transfer head, which can perform both the affixation of the semiconductor chips 1 to the first adhesive member 304 and their affixation to the third adhesive member 307. This affords a mounting device with a compact configuration.

The first transfer head 314, the second transfer head 316, and the mounting head 317 are configured to move in the Z, θ, xφ), and yφ directions, and carrier substrate holder 311, the mounting table 313, the first adhesive member holder 315, and the third adhesive member holder 318 are configured to move in the X and Y directions, but this is not necessarily the only option, and the configuration can be varied as needed depending on the device. For instance, the configuration can be such that the first transfer head 314, the second transfer head 316, and the mounting head 317 move in the X, Y, θ, xφ, and yφ directions, and the carrier substrate holder 311, the transfer table 313, the first adhesive member holder 315, and the third adhesive member holder 318 all move in the Z direction. Also, it is possible to omit mechanisms for moving in the θ, xφ, and yφ directions if they are unnecessary. For example, if there is no rotational deviation in the positions of the semiconductor chips 1 and the circuit board 309, the movement mechanism for the θ direction can be omitted. Also, if there is no need to adjust the parallelism between the semiconductor chips 1 and the circuit board 309, it is possible to omit the moving mechanisms for the xφ and yφ directions.

The dual-view optical system 312 can go in between the first transfer head 314 and the carrier substrate 2 during pickup the carrier substrate 2 to capture images of both. Also, when the positions of the semiconductor chips 1 on the first adhesive member holder 315 and the third adhesive member holder 318 are imaged during pickup of the semiconductor chips 1, and the semiconductor chips 1 picked up by the mounting head 317 are mounted on the circuit board 309 on the mounting table 313, the dual-view optical system 312 can go in between the mounting head 317 and the mounting table 313 and capture images of the semiconductor chips 1 and the circuit board 309. The captured images are subjected to image processing by a controller (not shown) to recognize any positional deviation. Then, the controller (not shown) takes this positional deviation into account, and performs control such that the mounting head 317 holds the semiconductor chips 1 and separates them from the third adhesive member 307, thereby joining the second faces of the semiconductor chips 1 to the circuit board 309.

The carrier substrate remover (not shown) is configured to include a laser beam emitter capable of irradiating the carrier substrate 2 with an excimer laser. Irradiating the carrier substrate 2 with the excimer laser from this laser light emitter allows the carrier substrate 2 and the semiconductor chips 1 to be easily separated. For example, in the case of micro LEDs, a carrier substrate made of sapphire can be irradiated with an excimer laser, which allows the sapphire to be easily separated from the micro LEDs.

The mounting method according to the fourth embodiment of the present invention can be executed by the mounting device 350 described above. Mounting the semiconductor chips 1 on the circuit board 309 while the heated circuit board 309 is kept at a constant temperature allows the semiconductor chips to be stably mounted on the circuit board at high speed and very accurately.

In the fourth embodiment, the configuration is such that the carrier substrate remover is provided to the mounting device 350, but this is not necessarily the only option, and can be modified as needed depending on the mounting device. For instance, the configuration can have two devices, namely, a carrier substrate removing device and a mounting device that has no carrier substrate remover. In other words, a carrier substrate removing device is provided at a step ahead of the mounting device, and the first adhesive member affixation step and the carrier substrate removal step are executed by this carrier substrate removing device. The configuration can also be such that the semiconductor chips 1 from which the carrier substrate has been removed by the carrier substrate removing device are adhered to the first adhesive member 304 and conveyed in this state by a conveyance means such as a robot to the first adhesive member holder 315 in the mounting device. This allows the mounting device to be more compact.

Also, in the fourth embodiment, the first transfer head 314, the second transfer head, and the mounting head 317 are provided to the single mounting device 350, but this is not necessarily the only option, and the configuration can be modified as needed. For instance, the configuration can have three devices, namely, a first mounting device A equipped with the first transfer head 314, a first mounting device B equipped with the second transfer head 316, and a second mounting device mounting device equipped with the mounting head 317. Or, as described above, the configuration can have two devices, namely, a first mounting device equipped with a shared transfer head, in which the first transfer head 314 and the second transfer head 316 are shared, and a second mounting device equipped with the mounting head 317. When there are a plurality of mounting devices, the configuration can be such that the semiconductor chips 1 are conveyed between the mounting devices by a transporting means such as a robot.

Thus, in the fourth embodiment, the adhesive strength of the first adhesive member is reduced after the second adhesive member has been affixed to the semiconductor chip by means of a mounting method in which a diced semiconductor chip whose first face is held on a carrier substrate is mounted on a circuit board that has been placed on a mounting table by a mounting head, the method comprising:

a first adhesive member affixation step of affixing a second face, which is a face of the semiconductor chip on the opposite side from the first face held on the carrier substrate, to a first adhesive member;

a carrier substrate removal step of removing the carrier substrate from the semiconductor chip;

a second adhesive member affixation step of affixing a second adhesive member to the first face of the semiconductor chip;

a first adhesive strength reduction step of reducing the adhesive strength of the first adhesive member;

a third adhesive member affixation step of separating the semiconductor chip to which the second adhesive member has been affixed from the first adhesive member, and affixing the second face to a third adhesive member;

a second adhesive strength reduction step of reducing the adhesive strength of the second adhesive member; and a mounting step of mounting the semiconductor chip on the circuit board by holding the first face of the semiconductor chip with the mounting head to separate the semiconductor chip from the third adhesive member, and joining the second face to the circuit board, wherein the adhesive strength of the third adhesive member is less than the adhesive strength of the first adhesive member. Therefore, foaming of the first adhesive member will not cause the semiconductor chip to be out of position or in the wrong orientation, and the semiconductor chip to be mounted can be easily separated since it is affixed to the third adhesive member whose adhesive strength is less than that of the first adhesive member, which allows the semiconductor chip to be stably and accurately mounted on the circuit board.

Also, the adhesive strength of the first adhesive member is reduced after the second adhesive member has been affixed to the semiconductor chip by means of a mounting device with which a diced semiconductor chip whose first face is held on a carrier substrate is mounted on a circuit board that has been placed on a mounting table by a mounting head, the device comprising:

a first adhesive member holder that has a first adhesive member heating mechanism and that holds a first adhesive member;

a carrier substrate remover that removes the carrier substrate from the semiconductor chip affixed to the first adhesive member;

a first transfer head that has a first transfer head heating mechanism and that affixes a second adhesive member to a first face of the semiconductor chip;

a second transfer head that has a second transfer head heating mechanism and that affixes the semiconductor chip to a third adhesive member;

a third adhesive member holder that has a third adhesive member heating mechanism and that holds the third adhesive member;

a first adhesive strength reducer that reduces the adhesive strength of the first adhesive member; and a second adhesive strength reducer that reduces the adhesive strength of the second adhesive member, wherein the adhesive strength of the third adhesive member is less than the adhesive strength of the first adhesive member. Therefore, foaming of the first adhesive member will not cause the semiconductor chip to be out of position or in the wrong orientation, and the semiconductor chip to be mounted can be easily separated since it is affixed to the third adhesive member whose adhesive strength is less than that of the first adhesive member, which allows the semiconductor chip to be stably and accurately mounted on the circuit board.

The mounting method and mounting device in the present invention can be widely used in fields in which semiconductor chips are stably and accurately mounted.

The invention claimed is:

1. A mounting method for mounting a diced semiconductor chip having a first face that is held on a carrier substrate and a second face that is an opposite face of the first face on a circuit board placed on a mounting table, the mounting method comprising:
    affixing the second face of the semiconductor chip to an adhesive sheet;
    removing the carrier substrate from the semiconductor chip;
    reducing an adhesive strength of the adhesive sheet subsequent to the removing of the carrier substrate from the semiconductor chip; and
    mounting the semiconductor chip on the circuit board by holding a first face side of the semiconductor chip with a mounting head to separate the semiconductor chip from the adhesive sheet, and joining a second face side of the semiconductor chip to the circuit board,
    the reducing of the adhesive strength of the adhesive sheet including heating the adhesive sheet and the semiconductor chip to a specific temperature at which the adhesive strength of the adhesive sheet is reduced, and
    the mounting of the semiconductor chip on the circuit board including
        conveying the semiconductor chip from the adhesive sheet to the circuit board while maintaining the semiconductor chip at the specific temperature at which the adhesive strength of the adhesive sheet is reduced by performing a heating control of the mounting head, and
        mounting the semiconductor chip on the circuit board while maintaining the circuit board at the specific temperature at which the adhesive strength of the adhesive sheet is reduced by performing a heating control of the mounting table.

2. The mounting method according to claim 1, wherein the removing of the carrier substrate from the semiconductor chip includes separating the carrier substrate by irradiating the carrier substrate with a laser beam.

3. The mounting method according to claim 1, wherein
a joint strength between the circuit board and the semiconductor chip in the mounting of the semiconductor chip on the circuit board is greater than a holding strength of the mounting head, and
the holding strength of the mounting head is greater than the adhesive strength of the adhesive sheet after the adhesive strength of the adhesive sheet has been reduced.

* * * * *